United States Patent
Tran et al.

(10) Patent No.: US 12,197,176 B2
(45) Date of Patent: Jan. 14, 2025

(54) SIMULATION AND AUTOMATED CONTROL OF PHYSICAL SYSTEMS

(71) Applicant: KOIDRA Inc., Seattle, WA (US)

(72) Inventors: Kenneth Tran, Tukwila, WA (US); Nhat M. Nguyen, Toronto (CA)

(73) Assignee: Koidra Inc., Seattle, WA (US)

( * ) Notice: Subject to any disclaimer, the term of this patent is extended or adjusted under 35 U.S.C. 154(b) by 552 days.

(21) Appl. No.: 17/522,353

(22) Filed: Nov. 9, 2021

(65) Prior Publication Data

US 2023/0144498 A1    May 11, 2023

(51) Int. Cl.
  *G05B 13/04*   (2006.01)
  *A01G 9/14*    (2006.01)
  *G06F 17/13*   (2006.01)
  *G06Q 50/02*   (2012.01)

(52) U.S. Cl.
  CPC .......... *G05B 13/048* (2013.01); *A01G 9/143* (2013.01); *G05B 13/041* (2013.01); *G06F 17/13* (2013.01); *G06Q 50/02* (2013.01)

(58) Field of Classification Search
  CPC ....... G05B 13/048; A01G 9/143; G06F 17/13; G06Q 50/02
  See application file for complete search history.

(56) References Cited

U.S. PATENT DOCUMENTS

| | | | |
|---|---|---|---|
| 2005/0209536 A1 | 9/2005 | Dariush | |
| 2012/0107921 A1* | 5/2012 | Willson | C12M 41/48 47/1.4 |
| 2013/0116987 A1* | 5/2013 | Zhang | G06F 8/40 703/2 |
| 2017/0045548 A1* | 2/2017 | Booij | G01P 5/001 |
| 2017/0184640 A1 | 6/2017 | Pileggi et al. | |
| 2017/0185057 A1* | 6/2017 | Ashdown | G06F 17/11 |
| 2018/0295783 A1* | 10/2018 | Alexander | G01N 33/0098 |
| 2020/0196535 A1* | 6/2020 | Dagondon | G06N 3/08 |

OTHER PUBLICATIONS

Chen, et al., "Neural ordinary differential equations", Advances in neural information processing systems 31, 2018, 13 pages.
Hemming, et al., "Remote control of greenhouse vegetable production with artificial intelligence—greenhouse climate, irrigation, and crop production", Sensors 19.8 (2019): 1807., 2019, 22 pages.

(Continued)

Primary Examiner — Gary Collins
(74) Attorney, Agent, or Firm — IP Spring

(57) ABSTRACT

Various aspects related to methods, systems, and computer readable media for simulating and controlling a physical system, such as, for example, a greenhouse. A computer-implemented method can include forming a computational graph, wherein a structure of the computational graph is based on one or more physical processes in the physical system, receiving, from one or more sensors, measured values of one or more observed states of the physical system, setting initial values of one or more unobserved states of the physical system, receiving values of one or more control inputs a for the physical system, and iteratively simulating the physical system on a computer using x, y and a as simulation inputs to the computational graph.

20 Claims, 14 Drawing Sheets

(56) References Cited

OTHER PUBLICATIONS

Kidger, et al., "Neural controlled differential equations for irregular time series", Advances in Neural Information Processing Systems 33, 2020, 12 pages.
Kritzinger, et al., "Digital Twin in Manufacturing: a categorical literature review and classification", IFAC—PapersOnLine 51.11, 2018, pp. 1016-1022.
Massaroli, "Dissecting neural odes", Advances in Neural Information Processing Systems 33, 2020, 12 pages.
Mathieu, et al., "Riemannian Continuous Normalizing Flows", Advances in Neural Information Processing Systems 33, 2020, 13 pages.
Pinckaers, et al., "Neural Ordinary Differential Equations for Semantic Segmentation of Individual Colon Glands", arXiv preprint arXiv:1910.10470, 2019, 5 pages.
Poli, et al., "Graph neural ordinary differential equations", arXiv preprint arXiv:1911.07532, 2019, 18 pages.
Poli, et al., "Hypersolvers: Toward fast continuous-depth models", Advances in Neural Information Processing Systems 33, 2020, 13 pages.
Poli, et al., "Torchdyn: a neural differential equations library", arXiv preprint arXiv:2009.09346, 2020, 6 pages.
Portwood, et al., "Turbulence forecasting via neural ODE", arXiv preprint arXiv:1911.05180, 2019, 7 pages.
Rackauckas, et al., "Universal differential equations for scientific machine learning", arXiv preprint arXiv:2001.04385, 2020, 55 pages.
Rubanova, et al., "Latent ordinary differential equations for irregularly-sampled time series", Advances in neural information processing systems 32, 2019, 11 pages.
Sparks, "Autonomous Greenhouse Challenge: and the Winner is . . . ", Retrieved from Internet: https://www.greenhousegrower.com/production/autonomous-greenhouse-challenge-and-the-winner-is/, Jun. 18, 2020, 7 pages.
Sparks, "What is the Current State of Labor in the Greenhouse Industry?", Retrieved from Internet: https://www.greenhousegrower.com/management/what-is-the-current-state-of-labor-in-the-greenhouse-industry/, Nov. 15, 2018, 10 pages.
United Nations, "Food Production Must Double by 2050 to Meet Demand from World's Growing Population, Innovative Strategies Needed to Combat Hunger, Experts Tell Second Committee", Retrieved from Internet: https://www.un.org/press/en/2009/gaef3242.doc.htm, Oct. 9, 2009, 6 pages.
USPTO, International Search Report for International Patent Application No. PCT/US2022/048193, Feb. 9, 2023, 2 pages.
USPTO, Written Opinion for International Patent Application No. PCT/US2022/048193, Feb. 9, 2023, 4 pages.
WIPO, International Preliminary Report on Patentability for International Patent Application No. PCT/US2022/048193, May 2, 2024, 5 pages.

* cited by examiner

SIMULATION AND AUTOMATED CONTROL OF PHYSICAL SYSTEMS

TECHNICAL FIELD

Embodiments relate generally to machine learning, and more particularly, to methods, systems, and computer readable media for simulation and automated control of physical systems.

BACKGROUND

In recent years, Artificial Intelligence (AI) has achieved great breakthroughs in many domains, including healthcare, medicine, finance, autonomous driving, and other domains. Within Agriculture, AI has been developed for weed management, early detection of plant disease, drip irrigation management, plant stress detection, and fruit detection or counting. However, the application of AI is still limited in some other domains of agriculture, specifically in controlled agriculture environments (CEA) including greenhouse crop production control or autonomous greenhouse management.

Conventional technologies involving commercial greenhouse control are merely rule-based in which the system does not learn and improve itself. The rules are specified by the growers, not all of whom are experts-most of the rules used in practice are simplistic and do not capture the complexity of the greenhouse dynamics.

The background description provided herein is for the purpose of presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

SUMMARY

Implementations and aspects described herein relate to simulation and control of physical systems.

According to one aspect, a computer-implemented method to simulate a physical system comprises: forming a computational graph with a plurality of nodes initialized with respective parameters, wherein a structure of the computational graph is based on one or more physical processes in the physical system, wherein the forming includes defining a respective differential equation that specifies a time derivative for each of x and y; receiving, from one or more sensors, measured values of one or more observed states of the physical system; setting initial values of one or more unobserved states of the physical system, wherein the unobserved states each correspond to a physical state of the physical system that is not measured; receiving values of one or more control inputs a for the physical system; and iteratively simulating the physical system on a computer using x, y and a as simulation inputs to the computational graph, wherein the simulating includes: solving the differential equations using an ordinary differential equation (ODE) solver to obtain a predicted value for x and y at a next time point; and adjusting at least one of the parameters of the computational graph based on a comparison of the predicted value of x at the next point and a groundtruth value of x at the next point as measured in the physical system.

Various implementations of the computer-implemented method are described.

According to one implementation, the differential equation for the time derivative of x is a sum of two terms, wherein a first term is based on a physics-based model of the physical system.

According to one implementation, the values of x, y, and a are inputs to the physics-based model, and the first term is output by the physics-based model.

According to one implementation, the values of x, y, and a are inputs to a correction network, and a second term of the two terms is output by the correction network.

According to one implementation, the physics-based model is trained by adjusting one or more model parameters of the physics-based model based on a difference between predicted values of x generated during the simulation with groundtruth values obtained from the one or more sensors.

According to one implementation, the correction network is a neural network trained by adjusting one or more model parameters of the neural network based on a difference between predicted values of x generated during the simulation with groundtruth values obtained from the one or more sensors.

According to one implementation, the physics-based model and the correction network are trained jointly to adjust respective model parameters.

According to one implementation, the differential equation for the time derivative of x is a sum of two terms, wherein a first term is based on a physics-based model of the physical system and a second term is based on a correction network, and wherein the physics-based model and the correction network are each adjusted based on outputs of a user-defined loss function.

According to one implementation, the computational graph is a first computational graph, and wherein the method further comprises: forming another computational graph for a reinforcement learning controller having a plurality of nodes initialized with respective parameters, wherein a structure of the computational graph takes x and y, or a history of x and y, and outputs the one or more control inputs a; receiving, from one or more sensors, measured values of one or more observed states of the physical system; setting initial values of one or more unobserved states of the physical system, wherein the unobserved states each correspond to a physical state of the physical system that is not measured; iteratively simulating the physical system with the reinforcement learning controller using x, y and a as simulation inputs to the another computational graph, wherein the simulating includes: using the reinforcement learning controller to output control input a for the physical system; solving the differential equations using an ordinary differential equation (ODE) solver to obtain a predicted value for x and y at a next time point; adjusting at least one of the parameters of the another computational graph of the reinforcement learning controller in order to improve and maximize user-defined reward functions; and repeating the iteratively simulating until a stopping criteria occurs.

According to one implementation: the physical system is a greenhouse; the greenhouse comprises one or more devices configured to alter one or more physical characteristics within an interior of the greenhouse; and the operations further comprise automatically adjusting the one or more devices based on the iteratively simulating.

In another aspect, a computer system to simulate and control a physical system is described. The computer system comprising: a memory with instructions stored thereon; and a processing device, coupled to the memory, the processing device configured to access the memory and execute the instructions, wherein the instructions cause the processing device to implement a model-based reinforced-learning (MBRL) agent that perform operations comprising: forming a computational graph with a plurality of nodes initialized with respective parameters, wherein a structure of the computational graph is based on one or more physical processes in the physical system, wherein the forming includes defining a respective differential equation that specifies a time derivative for each of x and y; receiving, from one or more sensors, measured values of one or more observed states of the physical system; setting initial values of one or more unobserved states of the physical system, wherein the unobserved states each correspond to a physical state of the physical system that is not measured; receiving values of one or more control inputs a for the physical system; and iteratively simulating the physical system using x, y and a as simulation inputs to the computational graph, wherein the simulating includes: solving the differential equations using an ordinary differential equation (ODE) solver to obtain a predicted value for x and y at a next time point; and adjusting at least one of the parameters of the computational graph based on a comparison of the predicted value of x at the next point and a groundtruth value of x at the next point as measured in the physical system.

Various implementations of the computer system are described.

According to one implementation, the differential equation for the time derivative of x is a sum of two terms, wherein a first term is based on a physics-based model of the physical system and a second term is determined using a correction network.

According to one implementation, the values of x, y, and a are inputs to the physics-based model, and the first term is output by the physics-based model.

According to one implementation, the values of x, y, and a are inputs to the correction network, and the second term is output by the correction network.

According to one implementation, the physics-based model is trained by adjusting one or more model parameters of the physics-based model based on a difference between predicted values of x generated during the simulation with groundtruth values obtained from the one or more sensors.

According to one implementation, the correction network is trained by adjusting one or more model parameters of the correction network based on a difference between predicted values of x generated during the simulation with groundtruth values obtained from the one or more sensors.

According to one implementation, adjusting the one or more model parameters is based on a regularization term.

According to one implementation, the physics-based model and the correction network are trained jointly to adjust respective model parameters According to one implementation, parameters of the correction network are adjusted during the simulation.

In yet another aspect, an automated greenhouse is described. The automated greenhouse comprising: a foundation with at least one growth medium for growing one or more plants within an interior of the automated greenhouse; one or more controllers configured to alter one or more physical characteristics within an interior of the automated greenhouse; and a computer system configured to control the one or more controllers, the computer system comprising: a memory with instructions stored thereon; and a processing device, coupled to the memory, the processing device configured to access the memory and execute the instructions, wherein the instructions cause the processing device to implement a model-based reinforced-learning (MBRL) agent that perform operations comprising: forming a computational graph with a plurality of nodes initialized with respective parameters, wherein a structure of the computational graph is based on one or more physical processes in the automated greenhouse, wherein the forming includes defining a respective differential equation that specifies a time derivative for each of x, y, and z; receiving, from one or more sensors, measured values of one or more observed states of the automated greenhouse; setting initial values of: one or more unobserved states of the automated greenhouse, wherein the unobserved states each correspond to a physical state of the automated greenhouse that is not measured; and one or more latent states for the automated greenhouse, wherein the latent states correspond to one or more additional factors that affect the automated greenhouse; receiving values of one or more control inputs a for the automated greenhouse; and iteratively simulating the automated greenhouse using x, y, z, and a as simulation inputs to the computational graph, wherein the simulating includes: solving the differential equations using an ordinary differential equation (ODE) solver to obtain a predicted value for x, y, and z at a next time point; and adjusting at least one of the parameters of the computational graph based on a comparison of the predicted value of x at the next point and a groundtruth value of x at the next point as measured in the automated greenhouse.

According to yet another aspect, portions, features, and implementation details of the systems, methods, and non-transitory computer-readable media may be combined to form additional aspects, including some aspects which omit and/or modify some or portions of individual components or features, include additional components or features, and/or other modifications; and all such modifications are within the scope of this disclosure.

DETAILED DESCRIPTION

Figure 1:
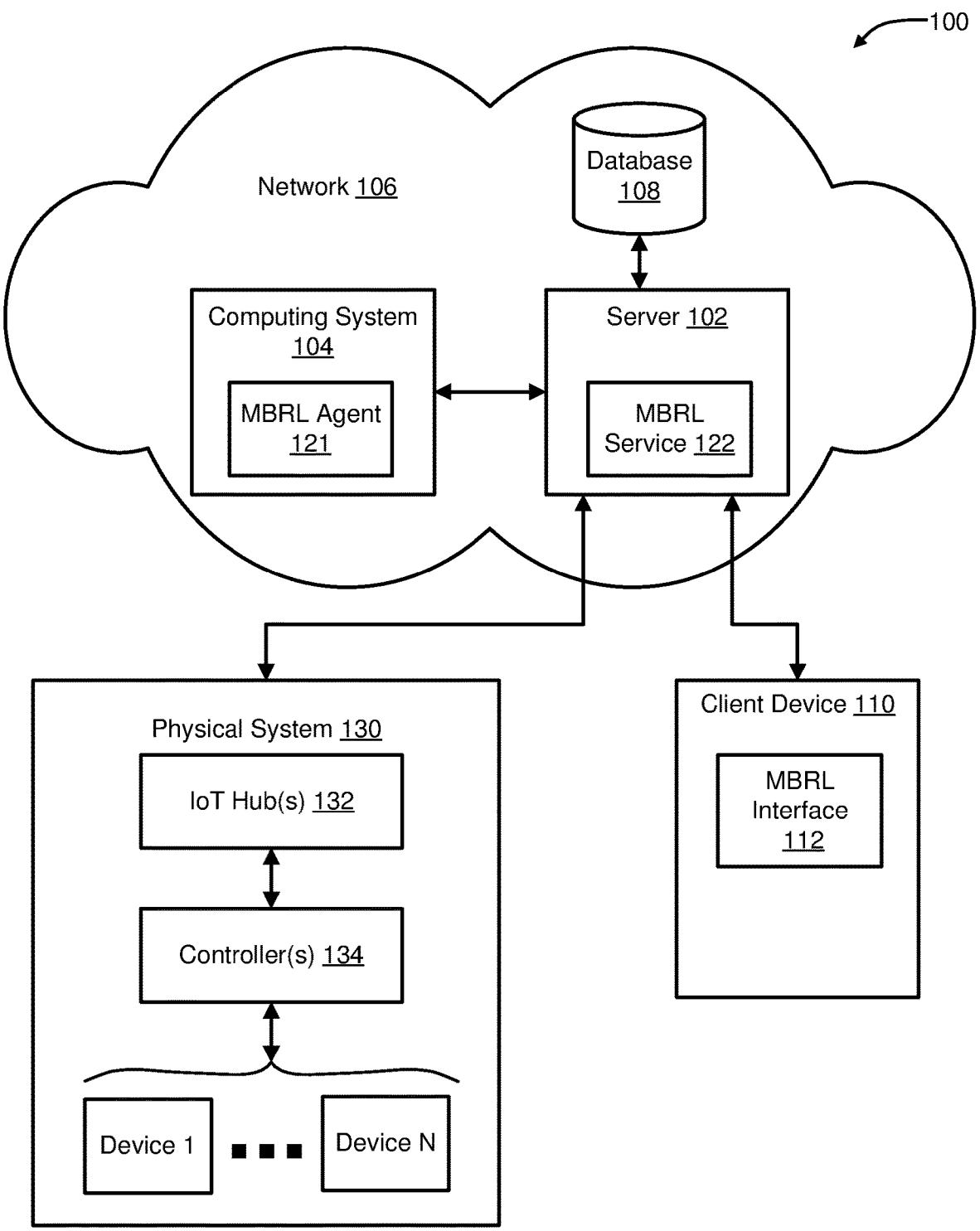
FIG. 1 is a diagram of an example network environment, in accordance with some implementations described herein.

One or more implementations described herein relate to the simulation of physical systems, such as closed environments (e.g., sealed greenhouses), partially open environments (e.g., naturally lit greenhouses), closed feedback loop environments (e.g., sealed physical spaces with HVAC), partially open feedback loop environments (e.g., physical spaces with at least one externally applied variable such as a naturally-lit or naturally aspirated greenhouse), and other physical systems or environments. Features can include training of a machine learning model (e.g., a neural network) to adjust one or more parameters until a predicted value of the physical system is within a threshold range of a groundtruth measurement within the physical system. Features can further include simulating the physical system with the trained machine learning model such that one or more outputs of the physical system are improved, increased, and/or reduced. The output of the physical system may be an agricultural yield (e.g., improvement may be an increased yield), a number of pests or pest growth (e.g., an improvement may be a reduced or minimized number), a ratio of nutritional content to non-nutritional content (e.g., an improvement may be increased drupe/fruit/seed size and a reduced volume of non-nutritional foliage), a ratio of edible content to inedible content (e.g., an improvement may be increased edible foliage or tubers and a reduced volume of inedible plant structures), and virtually any output than can be accurately measured and simulated with the trained machine learning model.

Initially, it is noted that while the below-description is made with reference to a greenhouse as the basis for a physical system that is simulated, the same may be varied in many ways. For example, any physical system where observed states and unobserved states may be modeled and simulated can be applicable. Accordingly, the described systems and methods for simulations should not be limited to solely those examples set forth herein, but should be interpreted to being extensible to any applicable physical system.

As described herein, a model-based reinforcement learning approach is used for addressing the autonomous control of a physical system, such as a greenhouse. Reinforcement Learning (RL) is an intersection of machine learning and control theory that aims to solve sequential decision making problems from a data-driven perspective. RL is an active research area within machine learning disciplines, and has been applied and proposed in many other applications, such as game playing and robotics. Within RL, model-based reinforcement learning (MBRL) is a rising paradigm that employs predictive models to reduce the number of physical trials (i.e. high sample efficiency), which is suitable for real-world control problems.

In the MBRL framework, the autonomous agent typically consists of three modular components.

Digital twin: a predictive model, for predicting the future state of the system given the current state and historical data. Digital twin is an emerging concept where a virtual replica of physical products or devices is used to run simulations before the action products are built and deployed. Digital twins take real-world data, typically from sensors, about a system or a product as input and simulate how the system will be affected by those inputs. In various implementations described herein, the digital twin provides simulated data for an artificial intelligence (AI) controller to learn. As the predictive quality of the digital twin directly affects the control performance of the AI controller, the use of physics-informed machine learning is used to capture the complex dynamics of greenhouse climate variables and crop development, and improve the accuracy of the digital twin.

AI Controller: a learning-based control model for planning and finding the optimal control decision. The controller learns via updating an internal neural network by observing trajectories including one or more of: sequences of state, action and reward that show how good or bad actions taken under different environmental states are—and how they affect the dynamic of the environment. In the most optimal setting, the trajectories come from interacting with the real environment. However, this can be prohibitively costly as the controller could require millions of trajectories. This problem can be addressed by augmenting the real world trajectories with imaginary ones. Because collecting data for greenhouses (or any physical system) is computationally-expensive and time-consuming, almost all of the trajectories described herein may be provided by the digital twin.

Data aggregator: for collecting data and serving the data to the learning of the digital twin and the controller.

These three components form a continual feedback loop. The feedback loop will allow the model continuously to improve and learn by itself, unlike a rules-based model (which is currently used in conventional AI-controlled greenhouses).

Hereinafter, a basic system architecture including various networked components configured to control a physical system (e.g., a greenhouse) based on an MBRL agent is described in detail.

FIG. 1: System Architecture

FIG. 1 illustrates an example network environment 100 for simulating one or more physical systems, in accordance with some implementations of the disclosure. FIG. 1 and the other figures use like reference numerals to identify like elements. A letter after a reference numeral, such as "110," indicates that the text refers specifically to the element having that particular reference numeral. A reference numeral in the text without a following letter, such as "110," refers to any or all of the elements in the figures bearing that reference numeral.

The network environment 100 (also referred to as "system" and/or "cloud computing environment" herein) includes a server 102, a computing system 104, a client device 110, a physical system 130, and a data store 108, all coupled via network 106.

The server 102 can include, among other things, MBRL Service 122 executing thereon. The MBRL service may be a software application configured to communicate with client device 110 (and software executing thereon), communicate with computing system 104 (and software executing thereon), as well as communicate with physical system 130 and components arranged to control the physical system 130. The MBRL service 122 may also communicate and receive instructions from, MBRL agent 121. In some implementations, the server 102 can include one or more computing devices (e.g., a cloud computing system, a rackmount server, a server computer, cluster of physical servers, virtual server, etc.). In some implementations, the server 102 may be an independent system, or be part of another system or platform.

Network 106 may include a public network (e.g., the Internet), a private network (e.g., a local area network (LAN) or wide area network (WAN)), a wired network (e.g., Ethernet network), a wireless network (e.g., an 802.11 network, a Wi-Fi® network, or wireless LAN (WLAN)), a cellular network (e.g., a Long Term Evolution (LTE) network), routers, hubs, switches, server computers, or a combination thereof. The network 106 may be configured to provide software-as-a-service, for example, through the server 102 and/or computing device 104.

The data store 108 may be a non-transitory computer readable memory (e.g., random access memory), a cache, a drive (e.g., a hard drive), a flash drive, a database system, or another type of component or device capable of storing data. The data store 108 may also include multiple storage components (e.g., multiple drives or multiple databases) that may also span multiple computing devices (e.g., multiple server computers).

The computing system 104 can include, among other things, the MBRL agent 121 executing thereon. The MBRL agent 121 may be an autonomous agent having a digital twin, an AI controller, and a data aggregator. The MBRL agent and associated functionality is described more fully below.

The client device 110 may include an instance of an MBRL interface 112 executing thereon. In some implementations, the MBRL interface 112 may permit users to use and interact with server 102, such as create digital twin models, manipulate parameters, train neural networks, configure controller(s), configure devices, and so forth.

The physical system 130 can include, among other things, one or more Internet of Things (IoT) hub(s) 132, one or more controller(s) 134, and a plurality of individual devices 1, N. Generally, although illustrated and described as an IoT hub, the hub 132 can also be implemented as any suitable networking hub capable of sending and receiving data to/from the MBRL service and controller(s) 134. Controller(s) 134 may include microcontrollers or other suitable controllers configured to send and receive data to/from the plurality of devices 1, N. The plurality of device 1, N may include any suitable devices, including sensors, actuators, and other devices suitable for sensing information related to the physical system 130 and/or controlling parameters related to the physical system 130.

In general and during operation, the hub(s) 132 may register and call upon controller(s) 134 to receive updated or latest device data. For example, the hub(s) 132 may send recorded sensor data to the server 102 and also request new or updated set points and/or parameters. The server 102 may send the recorded sensor data to database 108, for example, as a time series of sensor data. The server 102 may also request set point data from the computing system 104 and/or MBRL agent 121. For example, the MBRL agent 121 and/or computing system 104 may compute and return new or updated set points to the server 102. Subsequently, the server 102 may relay the new or updated set points to the hub(s) 132. Thereafter, the hub(s) 132 may transmit the new or updated set points to the controller(s) 134, to be applied at one or more of the devices 1, N. In this manner, the MBRL agent may be used to simulate one or more physical systems, and thereby control the physical system 130 based on the simulation. Operation of the MBRL agent 121, simulation of physical systems, adjusting parameters, relaying of set points, and other functionality, are described in more detail below.

Network environment 100 is provided for illustration. In some implementations, the network environment 100 may include the same, fewer, more, or different elements configured in the same or different manner as that shown in FIG. 1.

FIGS. 2-6: General Framework for Simulating a Physical System

As described above, the MBRL agent 121 may be used to simulate one or more physical systems 130. The MBRL agent 121 may be configured by the client device 110 and/or the server 102, using the computing system 104, and may use a reinforcement learning approach to establish an appropriate model from which to simulate, and control, the physical system 130 and/or other physical systems.

Figure 2:
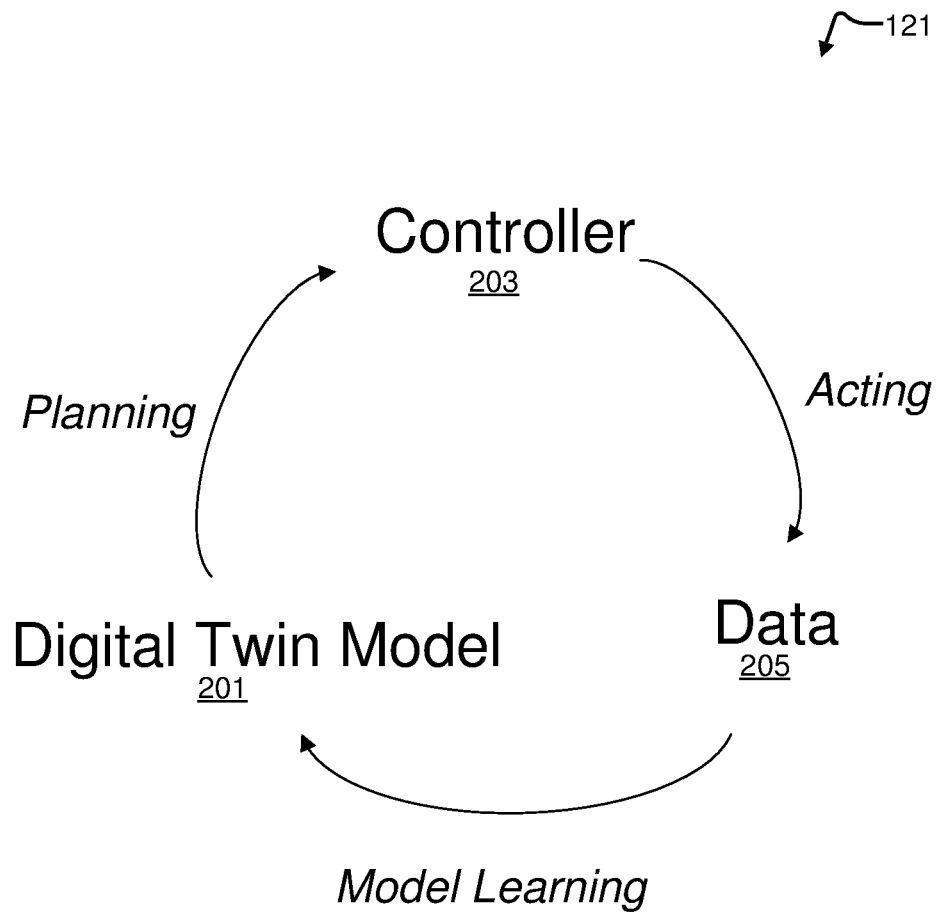
FIG. 2 is a diagram of a general agent for model-based reinforcement learning, in accordance with some implementations described herein.

Turning to FIG. 2, the MBRL agent 121 may include three main components—a digital twin model 201, a controller 203, and a data aggregator 205. Additional components may be implemented external to the MBRL agent 121, or under some circumstances, may be implemented therein.

The digital twin model 201 may be a model configured to predict the future state of the physical system 130 given a current state and historical data. The digital twin model may be based on a computational graph formed based on a process model. Furthermore, training of the digital twin model may be based on values restricted based on known or anticipated ranges (e.g., light transmission ratio of glass panels in a greenhouse must be between 0.6 and 0.95). Other restrictions may also be made to increase stability of training the digital twin model. As inferred, the digital twin model 201 may be a "digital twin" of the physical system 130. In general, the digital twin model 201 may receive information comprising real, observed measurements (i.e., groundtruths) from physical system 130, as well as initial states of variables chosen based on a plurality of factors.

The plurality of factors, if the physical system 130 is a greenhouse or agricultural tent, can include, but are not limited to, factors that affect the physical characteristics of the physical system 130, such as general configurations and configurations of components that are part of the physical system. In a greenhouse, for example, the plurality of factors may include construction configurations (e.g., cover area, floor area, air height, mean height, radiation absorption ratio, discharge coefficient, wind pressure coefficient, leakage, convective heat exchange parameters, and others), roof ventilation configurations (e.g., normalized area, vent vertical dimension, and others), side ventilation configurations (e.g., normalized area, vent vertical dimension, and others), cover configurations (e.g., PAR transmission, NIR transmission, material heat capacity, heat conductivity, thickness, internal cover capacity rate, external cover capacity rate, and others), thermal screen configurations (e.g., PAR transmission, NIR transmission, PAR reflection, NIR reflection, and others), blackout screen configurations (e.g., PAR transmission, NIR transmission, PAR reflection, NIR reflection, and others), rail pipe configurations (e.g., distance between pipes, external diameter, internal diameter, boiler capacity, and others), grow pipe configurations (e.g., distance between pipes, external diameter, internal diameter, boiler capacity, and others), top light configurations (e.g., capacity and others), interior light configurations (e.g., lumens per area, and others), $CO_2$ dosing configurations (e.g., capacity and others), fogging configurations (e.g., capacity and others), and any other suitable factors.

The plurality of factors, if the physical system 130 is used to grow and/or produce crops can also include, but are not limited to, yield (both edible and inedible), pests, weeds/nuisance plants, growth (e.g., height, width, and root ball/tuber-mass), fruiting amount (e.g., seeds, fruits, flowers, nuts, gourds, legumes, etc.), fruiting characteristics (e.g., size, color, grade, average weight, average casing/peel depth/thickness, flavor, etc.); as well as secondary factors including, but not limited to, species, anticipated life cycle, anticipated photoperiods, and any other suitable factor. In some implementations, for example in open greenhouses or tenting for fruit orchards, additional factors can include persistent blight, disease, fungal growth, mold growth, insecticide use, bark thickness, branching characteristics, trimming/pruning requirements, foliage measurements, pollinator species, flower removal (e.g., to decrease number of active flowers and increase size of resulting fruit), ripening periods, harvesting periods, and other factors. In some implementations, for example in greenhouses for varietal plant species rather than trees, additional factors can include foliage density, below foliage humidity, above foliage humidity, light penetration, pollinator species, fruit removal (e.g., for increasing size of remaining fruit), ripening periods, harvesting periods, and other factors.

Utilizing the additional factors, a set of trajectories may be implemented such that the controller 203 may appropriately learn/be reinforced. For example, the controller 203 may be a learning-based control model for planning and finding an improved or optimal control decision based on updating its internal neural network by observing trajectories. Using the plurality of additional factors to implement a set of initial parameters, the controller 203 may alter control decisions and receive rewards or scores based on factors such as yield, control cost, and other factors. Using these comparisons, the controller 203 may be updated through reinforcement learning and provide increasingly optimal results.

The comparisons, groundtruths, and other variables may be aggregated after acting/action by the controller 203, such that the data aggregator 205 may provide appropriate data analytics back to the digital twin model 201. For example, the data aggregator 205 is configured to collect data and serve the data for the reinforcement learning of the digital twin model 201 and the controller 203. As illustrated, this general framework for the MBRL agent 121 comprises a feedback loop of reinforced learning that can learn optimal or near optimal routes to increasing yield & quality while reducing nuisance factors such as excess foliage and pests, and also reducing natural resources used to provide nutritional requirements to plant species within the physical systems 130, 140.

Figure 3A:
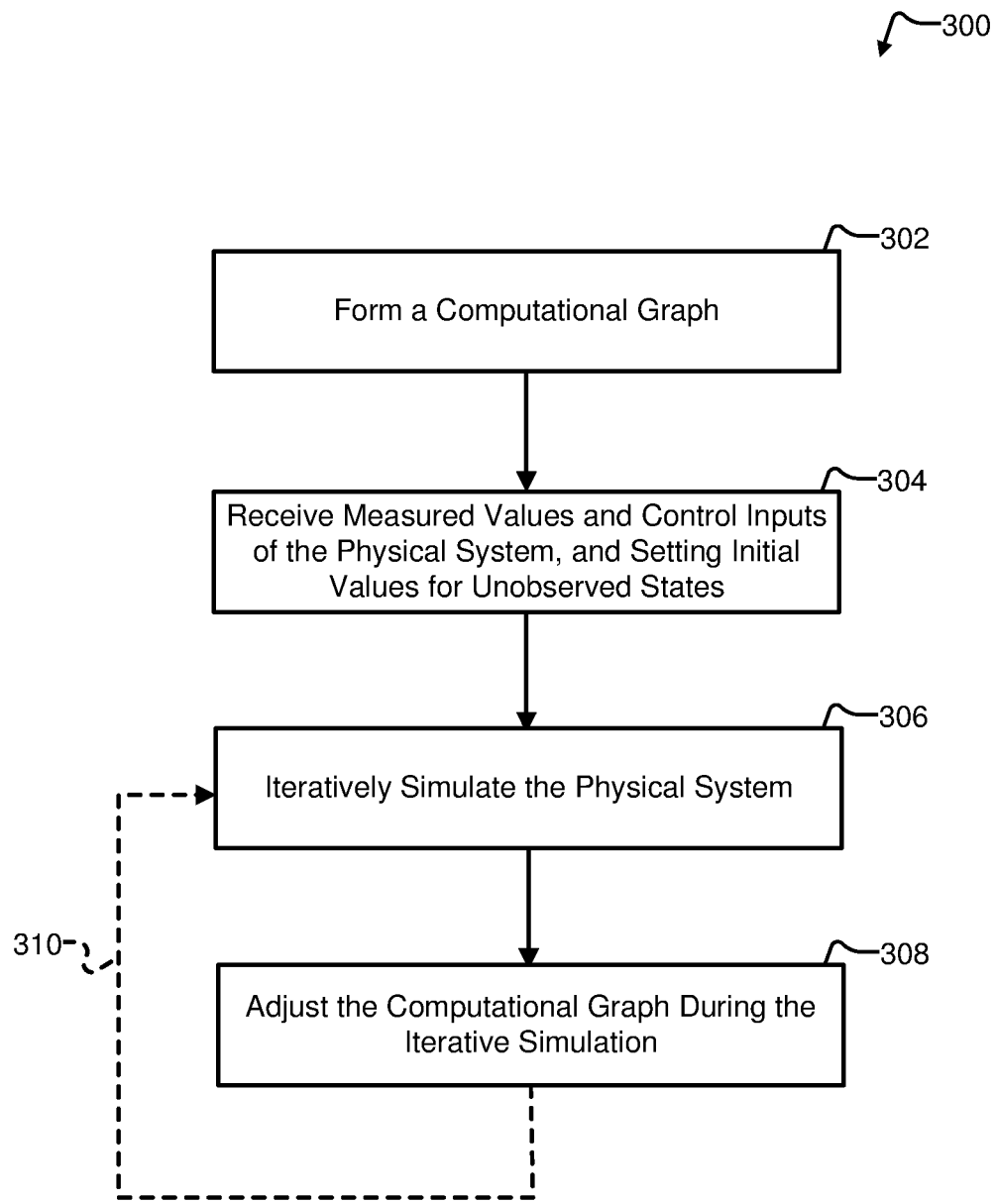
FIG. 3A is a flowchart of an example method for simulation of physical systems, in accordance with some implementations described herein.

Turning to FIG. 3A, a flowchart 300 of an example method for simulation of physical system 130 is provided. The method 300 may facilitate the MBRL agent 121 such that the above-described characteristics are appropriately implemented in real-time. Alternative flow diagrams 400, 450, and 460 are provided in FIGS. 4A-4C, respectively, and are separately described below for the sake of clarity of discussion. Turning back to FIG. 3A, the method 300 may begin at block 302.

Figure 5:
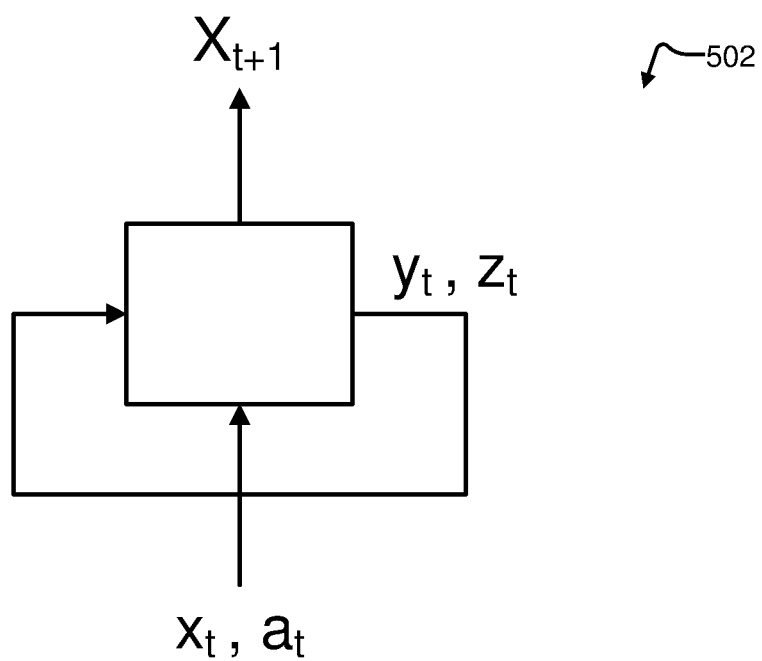
FIG. 5 is a diagram of a single node for simulation of physical systems, in accordance with some implementations described herein.

In block 302, a computational graph is formed. The computational graph may take the form, for example, of a computational graph having a 1:1 node correlation of a single aspect of the physical system 130. In this regard, each node of the computational graph will have physical semantics and interdependence with physical rules of the physical system 130. According to one implementation, the computational graph formed in block 302 is based on both unobservable states and observable states. In the computational graph, interdependence exists between nodes (based on time derivatives) and other non-derivatives (e.g., actual temperature values, actual humidity values). As illustrated in FIG. 5, for example, node 502 is a neural network node defined by semi-known physics equations (e.g., ordinary differential equations) bolstered by best estimates using prior knowledge of any of the plurality of additional factors described above. An example, incomplete framework that can be used to form a real computational graph (such as based on neural network node 502) during execution of the MBRL agent 121 is illustrated in FIG. 6.

Figure 6:
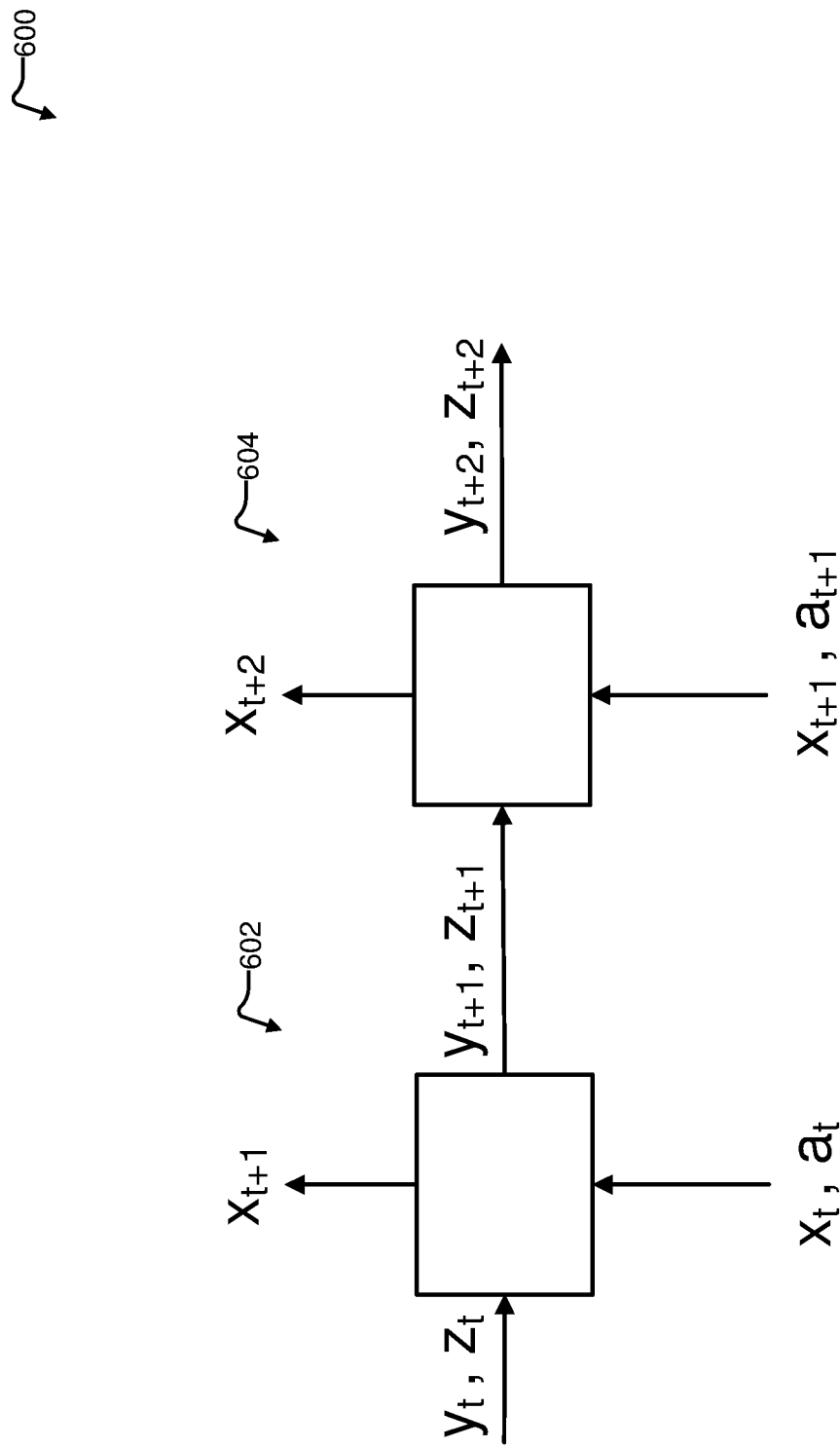
FIG. 6 is a diagram of a general node structure for simulation of physical systems, in accordance with some implementations described herein.

As illustrated in FIG. 6, the framework 600 includes inputs of known, observable states $x_t$, unobservable states $y_t$, and control inputs $a_t$ as well as outputs or predictions $x_{t+1}$, $x_{t+2}$, etc. Unknown or unobservable states are initialized with best estimates using prior knowledge. Upon forming the computational graph, the method 300 proceeds to block 304.

In block 304, a number of measured values (e.g., groundtruths) and control inputs of the physical system 130 are received. For example, the framework 600 is guided by physics and is a neural network. The neural network is provided the inputs or initialized parameters based on observable states $x_t$, unobservable states $y_t$, and control inputs $a_t$, and predicts x(t)+1, which is the predicted state based on the provided inputs. Upon providing the inputs, the method 300 subsequently proceeds to block 306.

At block 306, the physical system 130 is iteratively simulated. The method 300 subsequently proceeds to block 308.

At block 308, the computational graph is adjusted during the iterative simulation of block 306 (e.g., denoted through dashed-line 310). In this manner, based on feedback obtained by comparing predicted x(t)+1 with an observed groundtruth x, the weights and/or connectivity of the neural network nodes can be adjusted using an optimization algorithm such as an iterative optimization methodology (e.g., stochastic gradient descent, etc.). Over a large number of iterations of blocks 306-308, the adjustment of the neural network parameters leads to the neural network correctly predicting x(t)+1; thus indicating a "trained network". According to some implementations, the neural network formed based on framework 602 can be a directed acyclic graph (DAG) or a cyclic graph, as well.

Figure 3B:
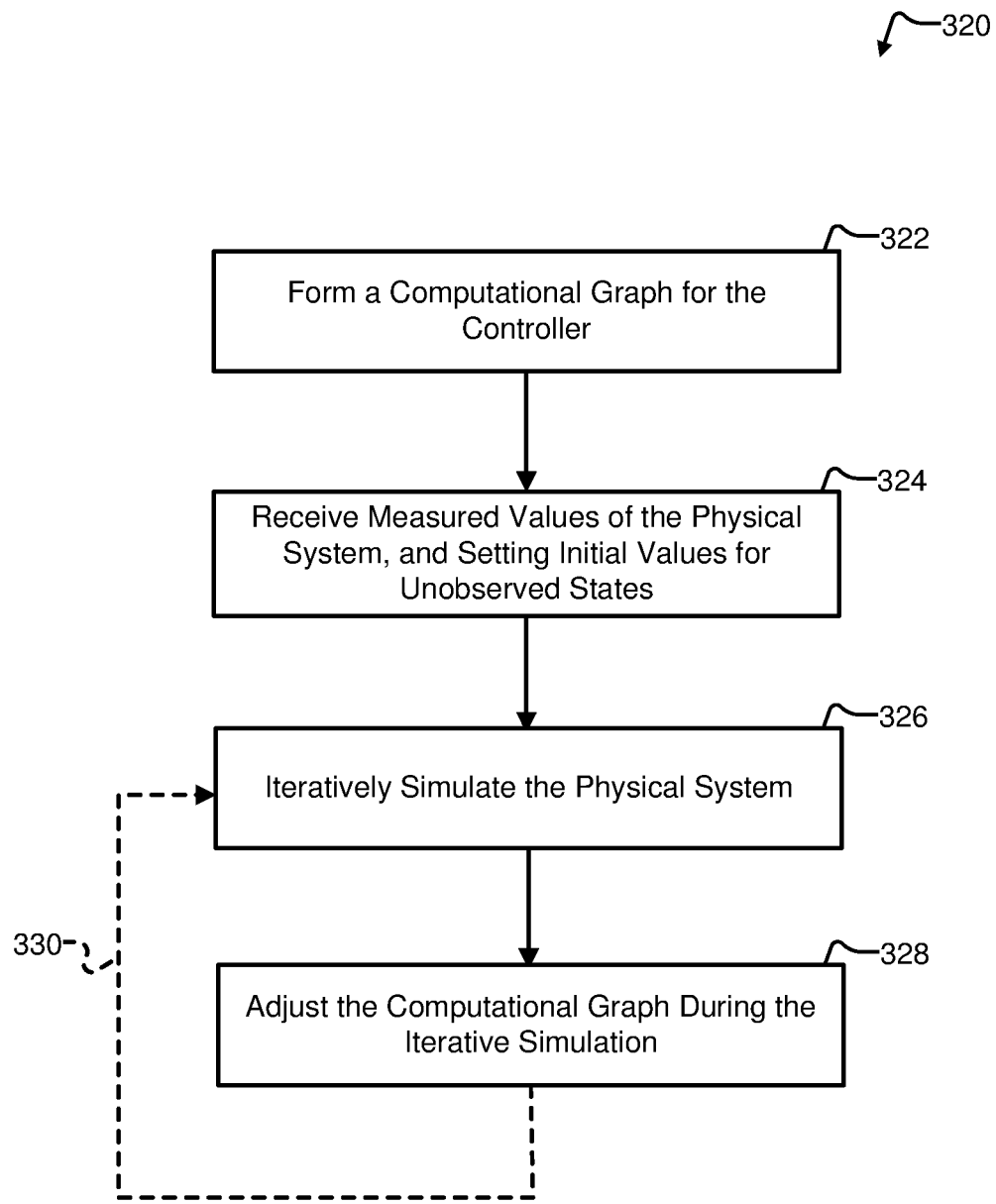
FIG. 3B is a flowchart of an example method of model-based reinforcement learning for simulation and control of physical systems, in accordance with some implementations described herein.

Turning to FIG. 3B, a flowchart 320 of an example method of model-based reinforcement learning for simulation and control of physical system 130 is provided. The method 320 may facilitate the controller 203 such that the above-described characteristics are appropriately implemented in real-time. Alternative flow diagrams 300, 400, 450, and 460 are provided in FIGS. 3A and 4A-4C, respectively, and are separately described below for the sake of clarity of discussion. Turning back to FIG. 3B, the method 320 may begin at block 322.

In block 322, a computational graph is formed for the reinforcement learning controller 203. The computational graph for the reinforcement learning controller 203 may comprise input nodes corresponding to the measured values and unobserved states (e.g., see block 324). The rest of the computational graph can follow the physical equations, follow a simple feed-forward neural network structure, and/or follow any other suitable structure.

The computational graph takes x and y, or a history of x and y, and outputs the one or more control inputs a. Upon forming the computational graph, the method 320 proceeds to block 334.

In block 324, a number of unobserved states of the physical system 130 are received. The method 320 may include setting initial values of one or more unobserved states of the physical system, wherein the unobserved states each correspond to a physical state of the physical system that is not measured. Upon providing the inputs, the method 320 subsequently proceeds to block 326.

At block 326, the physical system 130 is iteratively simulated using the controller 203. The method 320 subsequently proceeds to block 328.

Figure 4A:
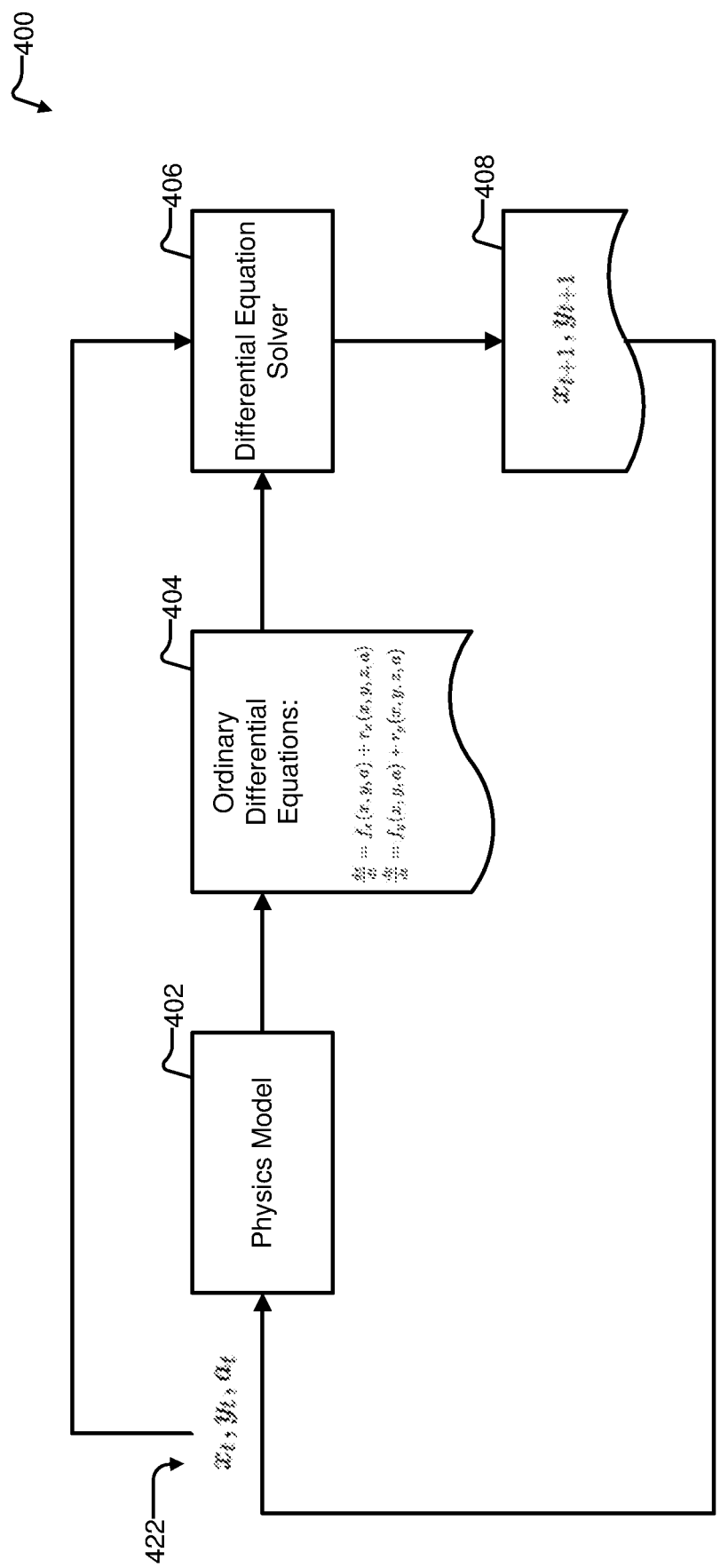
FIG. 4A is an alternative flowchart of an example method for simulation of physical systems, in accordance with some implementations described herein.

At block 328, the computational graph is adjusted during the iterative simulation of block 326 (e.g., denoted through dashed-line 330). In this manner, the method 320 also comprises, based on blocks 326, 328, and 330, using the controller to output control input a for the physical system simulation, and solving the differential equations using an ordinary differential equation (ODE) solver to obtain a predicted value for x and y at a next time point. The method 320 also includes adjusting at least one of the parameters of the computational graph of the controller in order to improve and maximize user-defined rewards. Furthermore, the method 320 also includes repeating the iteratively simulating until a stopping criteria occurs, for example, when the rewards no longer increase substantially, or a maximum number of training steps is achieved. Other stopping criteria may also be applicable. Turning now to FIG. 4A, an alternative illustration of portions of the methodology of FIGS. 3A and 3B is provided.

As shown in FIG. 4A, the alternative flowchart 400 depicts stages of the example iterative methodology of stochastic gradient descent. For example, the physics model 402 is initialized as described above, by adjusting an initial value of parameters based on known, observed states, and variables based on unknown, unobserved states. Furthermore, ordinary differential equations 404 are implemented in a computational graph (e.g., a cyclic graph or directed acyclic graph). The ordinary differential equations 404 can be chosen from a group of known physics equations that describe the physical system 130.

While described as "known physics equations," it should be understood that the same is varied during execution of the methods 300, 400 as described above. A basis is made from known physics equations which are then iteratively optimized, as described herein, to create a trained neural network that can differ greatly from the initial assumptions provided by the known physics equations. In this manner, a novel neural network is created based on each individual physical system.

As shown in flowchart 400, a differential equation solver, such as an ordinary differential equation solver (ODE) 406, is used to solve initial differential equations 404 and provide solutions 408. The solutions (e.g., solved for t+1) are then fed back into the physics model 402 for an additional iteration.

Figure 4B:
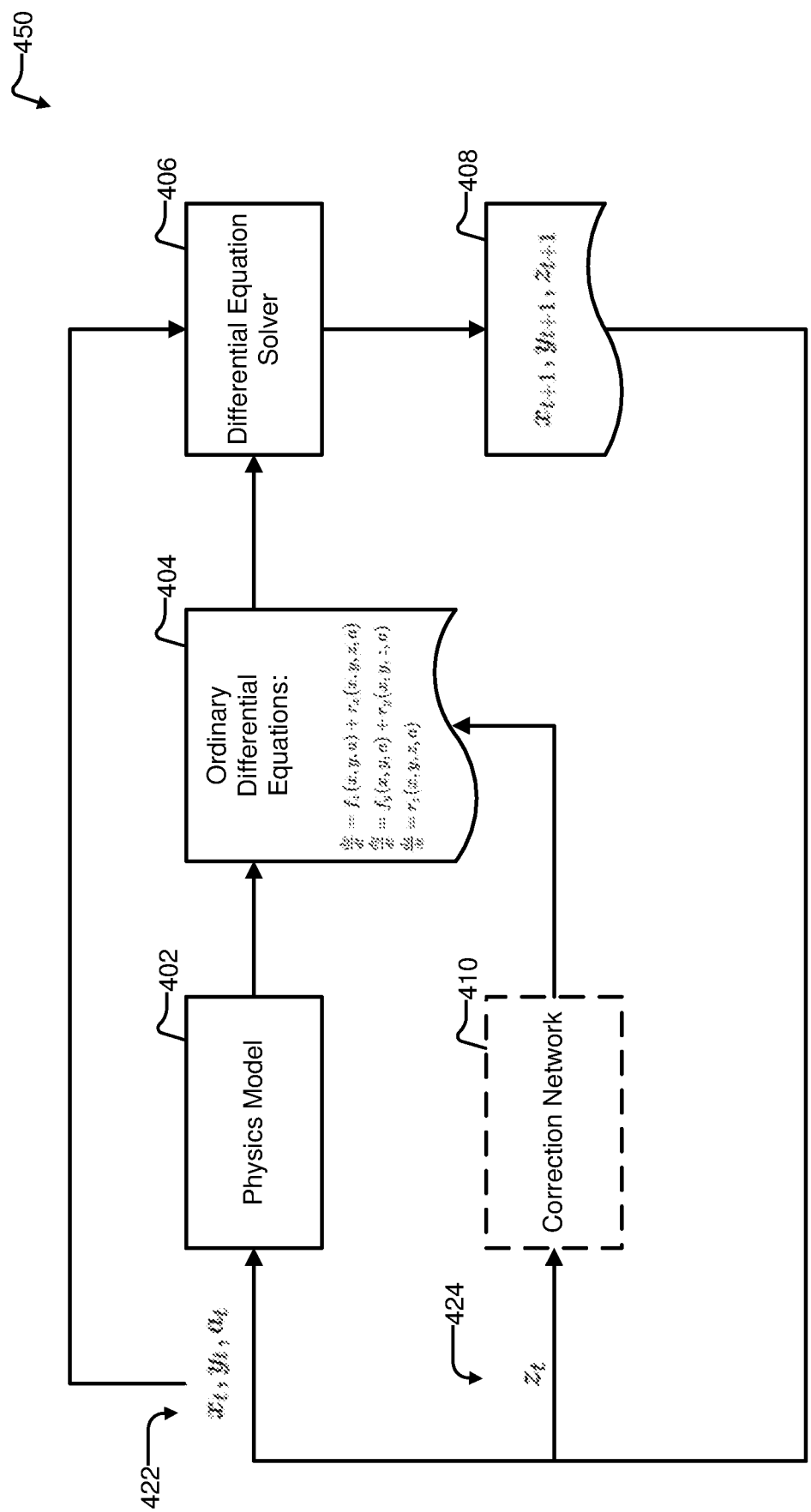
FIG. 4B is an alternative flowchart of an example method for simulation of physical systems, in accordance with some implementations described herein.

Turning now to FIG. 4B, an alternative illustration of this methodology is provided.

As shown in FIG. 4B, the alternative flowchart 450 depicts stages of the example iterative methodology of stochastic gradient descent. The physics model 402 is initialized as described above, by adjusting an initial value of parameters based on known, observed states, variables based on unknown, unobserved states, and variables based on unknown, latent states. Ordinary differential equations 404 are implemented in a computational graph (e.g., a cyclic graph or directed acyclic graph). The ordinary differential equations 404 can be chosen from a group of known physics equations that describe the physical system 130.

As shown in flowchart 450, a differential equation solver, such as an ordinary differential equation solver (ODE) 406, is used to solve initial differential equations 404 and provide solutions 408. The solutions (e.g., solved for t+1) are the fed back into the physics model 402 for an additional iteration.

Finally, a correction network 410 is used to alter the ordinary differential equations 404 based on the observed latent state z(t) (424). Similarly, the physical model receives x(t), y(t), and a(t) (422) such that the initial physics model 402 and the ODE 406 can be fine-tuned during training.

Figure 4C:
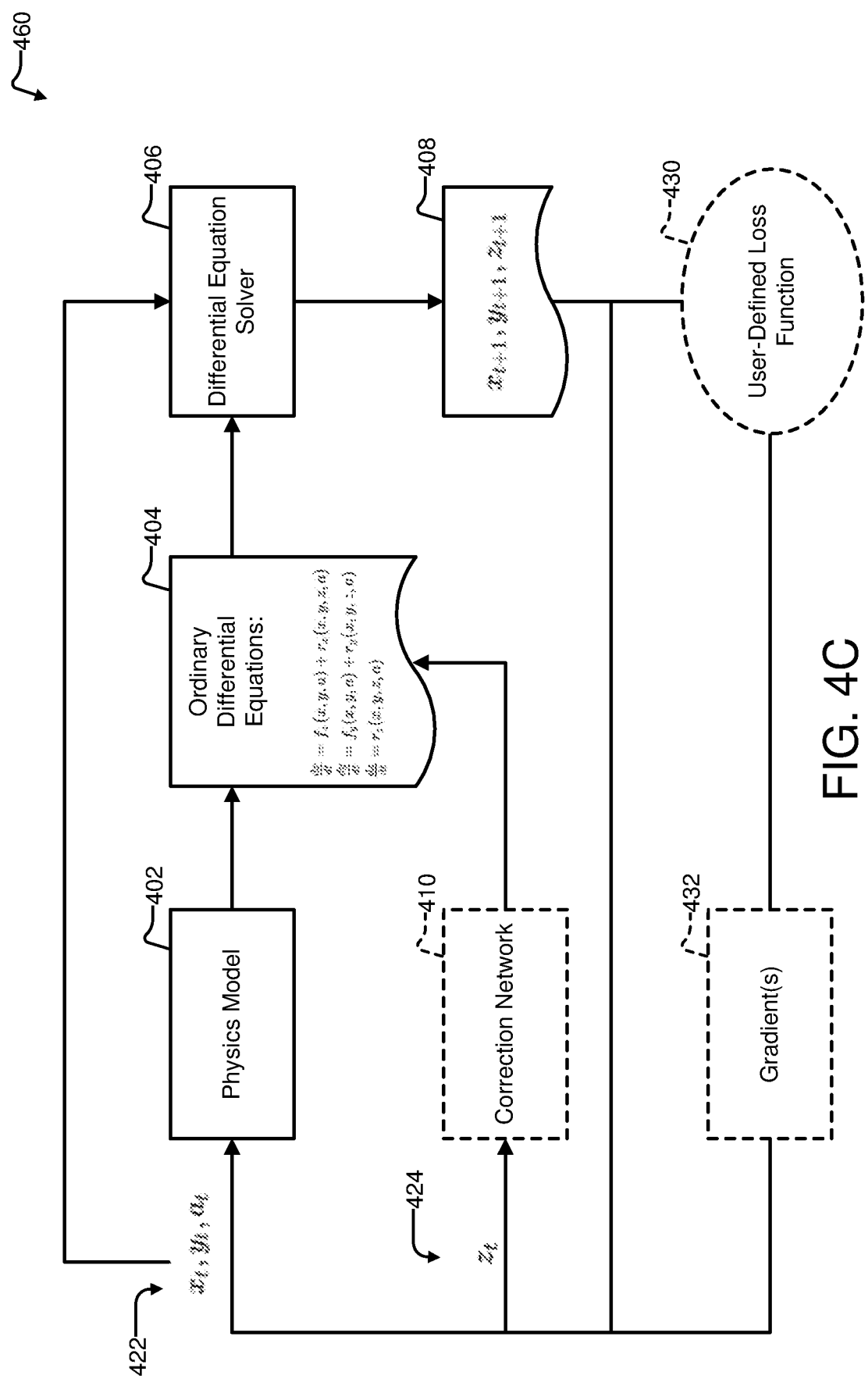
FIG. 4C is an alternative flowchart of an example method for simulation of physical systems, in accordance with some implementations described herein.

Turning now to FIG. 4C, an additional alternative illustration of this methodology is provided.

As shown in FIG. 4C, the alternative flowchart 460 depicts stages of the example iterative methodology of stochastic gradient descent. The physics model 402 is initialized as described above, by adjusting an initial value of parameters based on known, observed states, variables based on unknown, unobserved states, and variables based on unknown, latent states. Ordinary differential equations 404 are implemented in a computational graph (e.g., a cyclic graph or directed acyclic graph). The ordinary differential equations 404 can be chosen from a group of known physics equations that describe the physical system 130.

The ordinary differential equation solver (ODE) 406 is used to solve initial differential equations 404 and provide solutions 408. The solutions (e.g., solved for t+1) are the fed back into the physics model 402 for an additional iteration.

The correction network 410 is used to alter the ordinary differential equations 404 based on the observed latent state z(t) (424). Finally, a user-defined loss function 430 may produce gradients 432 based on an automatic differentiation network to update both of the physics model 402 and the correction network 410.

It is noted that the correction network 410 and user-defined loss 430 described above with relation to FIGS. 4B and 4C are optional, and may be omitted (as shown in FIG. 4A) in any implementation.

With regard to training, and as illustrated in framework 600, nodes of the neural network compute or predict the next state x(t)+1 based on observed states x, y, and control input a—over multiple iterations—and the computation graph is adjusted (e.g., learnable parameters are tuned based on feedback) so that the prediction is made more accurate. Observed latent states z may also be used in some implementations.

Figure 4D:
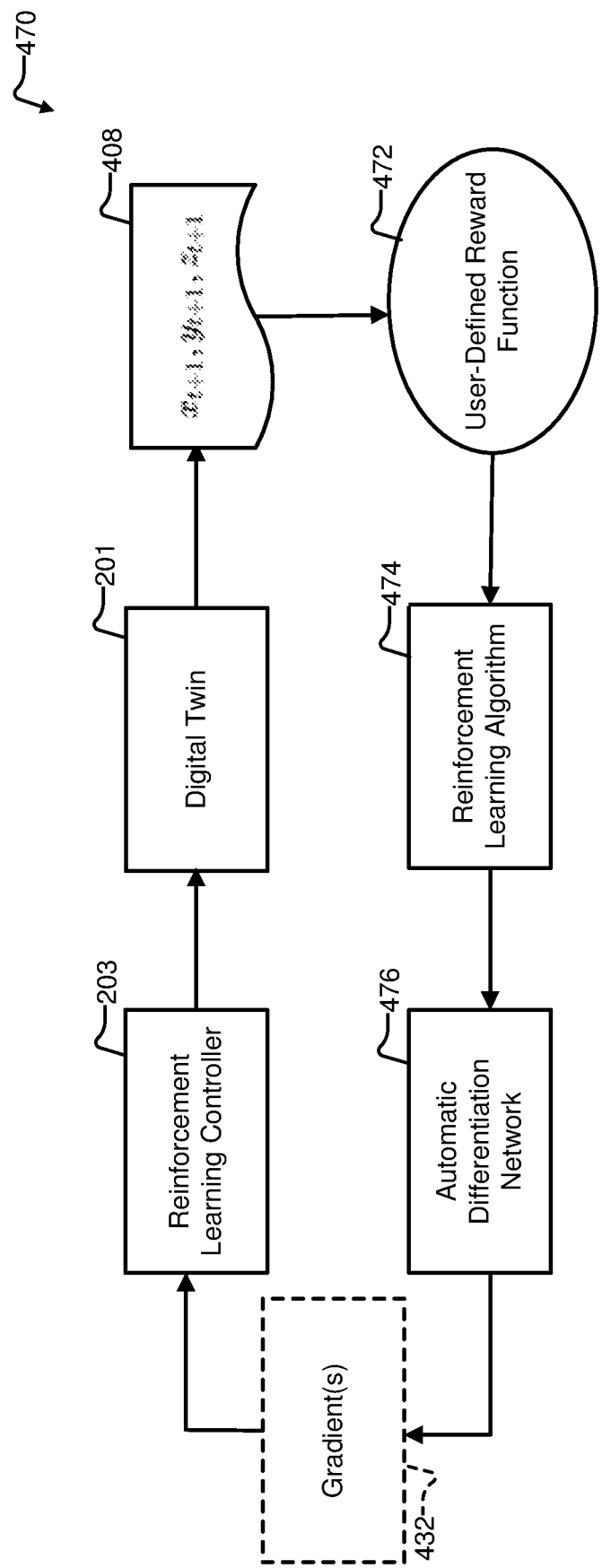
FIG. 4D is a flowchart of an example method of training a reinforcement learning controller, in accordance with some implementations described herein.

Turning now to FIG. 4D, an illustration of a methodology of training the reinforcement learning controller 203 is provided.

As illustrated, the digital twin model 201 provides solutions 408 (described in detail above) which are used to aid in defining a user-defined reward function 472. This reward function 472 is used only in training the controller 203 of the reinforcement learning agent 121. For example, as used herein, there are two models (illustrated in FIG. 2): the digital twin model 201 is trained using the loss function 430 that compares to the groundtruth(s) and the controller model 203 is trained with a reward/score function (e.g., user-defined function 472) that is hand-designed by a user (e.g., or an expert) to evaluate how well the agent 121 performs. For example, a high yield may result in a higher reward, while more electricity used may result in a lower reward.

The user-defined reward function 472 may then be used for the reinforcement learning algorithm 474 and automatic differentiation network 476 to create a training update and gradients 432, to train the reinforcement learning controller 203. The trained reinforcement learning controller 203 outputs a_t, and does not output x_t, y_t. In order to train and make the digital twin 201 better, the ground truth value of x_t, y_t is needed. Hence, the control a_t may be executed in the real physical system to collect additional groundtruth data for use in training the digital twin model 201. The additional groundtruth data collection may include, for example, better and more diverse control $a_t$ (e.g., of 422) illustrated and described above. In this manner, the iterative training methodology bolsters both models of the MBRL agent 121. An additional benefit of having a better controller is that it can guide the digital twin model to sample more in regions of the observation space that yields better results.

Considering the large number of iterations used to train each implemented neural network based on each physical system (e.g., 130), the feedback loop of reinforced learning causes the MBRL agent 121 to learn optimal or near optimal routes to increasing yield & quality while reducing nuisance factors such as excess foliage and pests, and also reducing natural resources used to provide nutritional requirements to plant species within the physical system 130. Moreover, the rapid computation provided by the MBRL agent 121 can facilitate evaluation of many trajectories and adjust predictions in a manner faster than traditional rules-based automation approaches and traditional cause-and-effect human intervention farming approaches. Thus, in this manner, technical benefits include reduced labor while experiencing increased yield, as well as reduced natural resource use while increasing yields. Thus, the MBRL agent 121 provides a novel control component that when implemented in a greenhouse, provides technical effects that include less human intervention in adjusting parameters for a greenhouse as well as less use of natural resources, pesticides, nutrient supplements, fertilizers, and other resources and/or chemicals. The described methodologies and systems herein enable adaptive and efficient food production that has a cascading effect of increasing crop yield while reducing resource usage (including arable land use, water use, and power use).

Figure 7:
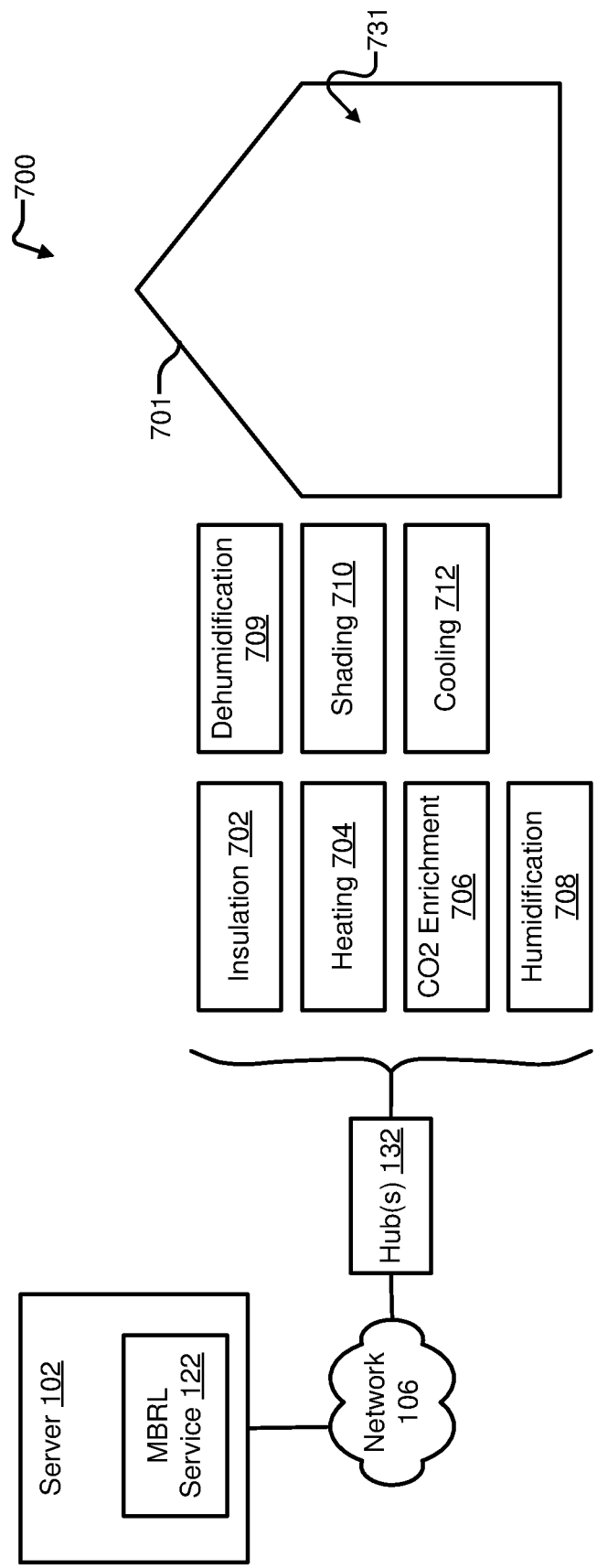
FIG. 7 is a schematic of a proposed physical system for simulation, in accordance with some implementations described herein.

As described above, physical systems can be simulated through the MBRL agent 121 such that predicted states more closely match actual, observed outputs with little human intervention or reliance on traditional methods that are time- and resource-intensive. Turning now to FIG. 7, an example physical system 700 is described in detail.

FIG. 7: An Example Physical System

FIG. 7 is a schematic of an example physical system 700. The physical system 700 may include an overall housing, or greenhouse, 701 as well as hub(s) 132 and associated devices. The greenhouse 701 may include a base or foundation that provides a growth medium for nurturing and growing a variety of plant species. The foundation may be sealed from external factors or may be unsealed. The growth mediums may be containerized mediums, aquaculture mediums, hydroponic mediums, soil-less mediums, rockwool mediums, clay-based mediums, or any suitable combination of the same.

The greenhouse 701 may also include one or more walls extending upward from the foundation and configured to support a roof or sheltered covering. The one or more walls may be formed based on any suitable technique or material. For example, the greenhouse 701 may include one or more walls formed of wood, plastic, metal, rigid, semi-rigid, translucent, semi-translucent, transparent, and other materials. The greenhouse 701 can also include one or more windows, apertures, doors, doorways, lintels, closures, or other structures such that humans and plants may be moved into and out of the greenhouse 701.

The greenhouse 701 may further include a roof or sheltered covering extending over the foundation and at least partially over the walls. However, alternative forms of greenhouses where independent supportive members such as vertical members, catawampus members, cross members, and other supportive structures may also be applicable. Furthermore, although described as a greenhouse, tents and/or partially open structures are also applicable.

As further shown in FIG. 7, the greenhouse 701 may include a plurality of devices, sensors, and/or components configured to control an internal environment 731, to provide natural resources to the greenhouse 701, to facilitate the growth of plants therein, and to alter physical characteristics within the greenhouse (e.g., temperature, humidity, etc.). For example, the greenhouse 701 may include devices for insulation 702, heating 704, $CO_2$ enrichment 706, humidification 708, de-humidification 709, shading 710, and/or cooling 712, with each being controllable (or at least partially controllable) by the MBRL agent 121 through the hub(s) 132 or directly by the MBRL agent 121. Furthermore, each device 702, 704, 706, 708, 709, 710, and/or 712 may include one or more applicable sensors, in operative communication therewith, configured to sense a physical variable such as temperature, humidity, light, and other variables. The one or more applicable sensors may be fixedly attached to portions of the greenhouse 701. The one or more applicable sensors may also be removable or replaceable sensors that may be adjusted in positioning depending upon factors including: type of sensor, location of plants, type of plants, growth medium, existence of containers for growth, and/or other suitable factors.

Insulation 702 may include any suitable insulation that can be supported by one or more structural components of the greenhouse 701. The insulation 702 may be an intrinsic property of materials used in construction of the greenhouse 701, for example, glass panels used for walls, glass panels used for a ceiling, plastic sheeting used to cover the greenhouse 701, or other properties of construction materials. The insulation 702 may also include permeable or semi-permeable insulation materials such as open or closed cell foams, sheets, or panels. The insulation 702 may also include partially or fully light-transparent material that insulates while also allowing natural light to penetrate the interior 731.

Heating 704 may be provided by electrical resistance heating, solar heating, exhaust-recycling heating, propane or natural gas combustion heating, geothermal heating, reverse Carnot heating devices, and/or other suitable heating devices. Heating may also be provided through natural methods including solar heating devices configured to be controlled by the MBRL agent 121 such as roll-shades, apertures, and/or electrically-controlled glass panes. Moreover, heating 704 may also include fossil fuel burning reactors, biomass reactors, combination biomass-fossil fuel reactors, and/or radiative buffering devices.

$CO_2$ enrichment may be provided by any applicable or suitable $CO_2$ source. For example, and without limitation, $CO_2$ enrichment may be controlled by the MBRL agent 121 and can include externally applied $CO_2$ supplementation from tanks or $CO_2$ generating devices. $CO_2$ supplementation sources can include "green sources" that are configured to capture environmental $CO_2$ and provide the same to the interior 731. In this manner, $CO_2$ measurement may be facilitated by the MBRL agent 121 such that impure or withering CO2 sources may be controlled to deliver a higher capacity while pure or concentrated CO2 sources may be controlled to deliver a lower capacity of CO2 based on needs established by the MBRL agent 121.

Humidification 708 may include any suitable system or component both controllable by the MBRL agent 121 and capable of increasing the humidity within the interior 731. The humidification 708 may include water vapor application, mist application, aqueous diffusion (e.g., hydrogel devices), and other suitable humidification devices. Additionally, humidification 708 may be used in conjunction with a watering device such that balanced water use is achieved while also controlling humidity added to the interior 731.

De-humidification 709 may include ventilation devices, electronic de-humidification devices, forced ventilation, natural ventilation and/or mechanical cooling. Furthermore, de-humidification 709 may capture and store a reservoir of water removed from the atmosphere within the interior 731 for use by humidification 708 such that fresh water use is also reduced. Moreover, a combination humidification/de-humidification device may be used to supplement and/or replace both of the humidification 708 and de-humidification 709 devices.

Cooling 712 may include any cooling device controllable by the MBRL agent 121. For example, cooling 712 can include natural ventilation with shutters/dampers, forced ventilation, pad & fan cooling, mechanical cooling, HVAC/Carnot cycle cooling, and/or a combination of fogging/humidifying cooling.

While described above as discrete components, it should be readily understood that combinations of devices that provide partial control of some aspects (e.g., humidity and cooling) as well as full control of some aspects (e.g., de-humidifying and irrigation using captured atmospheric vapor) are also applicable herein.

As described above, a physical system, such as greenhouse 701, may be simulated and controlled by the MBRL agent 121 such that a desirable output is predicted and repeatedly achieved. The desirable output can include increased yield of food products grown naturally through the artificially intelligent neural network implemented by the MBRL agent 121. Resource usage can be reduced through the MBRL agent 121, while overall food product output may be increased. Moreover, by allowing the MBRL agent 121 to simulate different physical systems through reinforced learning, multiple types of physical systems can be simulated, and therefore controlled, with reduced programmatic effort to fine-tune for new physical systems. Hereinafter, a more detailed explanation of the methodology governing the execution of the MBRL agent 121 is provided with reference to FIG. 8 and FIG. 9.

Figure 8:
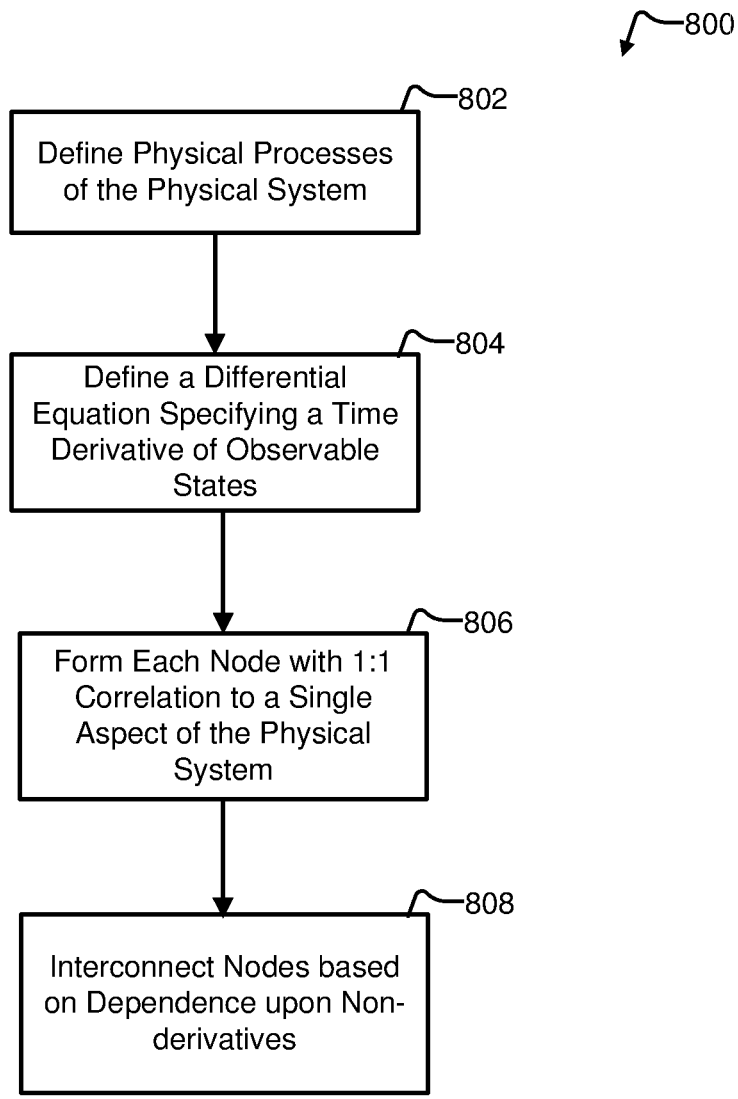
FIG. 8 is a flowchart of a method of generating a computational graph, in accordance with some implementations described herein.

FIG. 8: Forming the Computational Graph

FIG. 8 is a flowchart of an example method 800 of forming a computational graph, in accordance with some implementations. The method 800 begins at block 802.

In block 802, physical processes of the physical system (e.g., physical system 130 or 700) are defined. For example, the physical processes of the physical system may be physical processes that are well-defined based on all additional factors described in detail above. For example, with prior domain knowledge of processes involving aspects of the interior of a greenhouse, which is dependent upon insulation, light, humidity, temperature, and so forth, these processes may be each defined based upon a particular physical system. Furthermore, a set of observable and unobservable states (e.g., based on an available number of sensors or other hardware) may also be defined. Block 802 is followed by block 804.

In block 804, a differential equation is defined for a time derivative of each observable state of the physical system, based on the defined physical processes. Block 804 is followed by block 806.

In block 806, a node of the computational graph is formed with a 1:1 correlation to a single aspect of the physical system, as defined in the physical processes and differential equations of blocks 802-804. For example, a single aspect of the physical system can include a relation of humidity to temperature. In this regard, a node for humidity is defined that both depends upon a non-time-derivative (e.g., measurable temperature) and an unobservable state (e.g., the actual humidity if a sensor is unavailable). A plurality of nodes are formed for each aspect of the physical system that can be defined in relation to unobservable and observable states based on available sensors. Block 806 is followed by block 808.

In block 808, the nodes formed in block 806 are interconnected based on dependence on the non-derivatives. For example, as the non-derivatives, or observable states can be directly measures with available sensors, the nodes can be interconnected based on these dependencies. Unobservable states may be calculated within each node representative of that aspect of the physical system.

Upon forming and interconnecting the nodes, a fully formed computational graph is established that enables predictions based on operation of the MBRL agent 121, and simulation of the physical system, as described more fully below with reference to FIG. 9.

Figure 9:
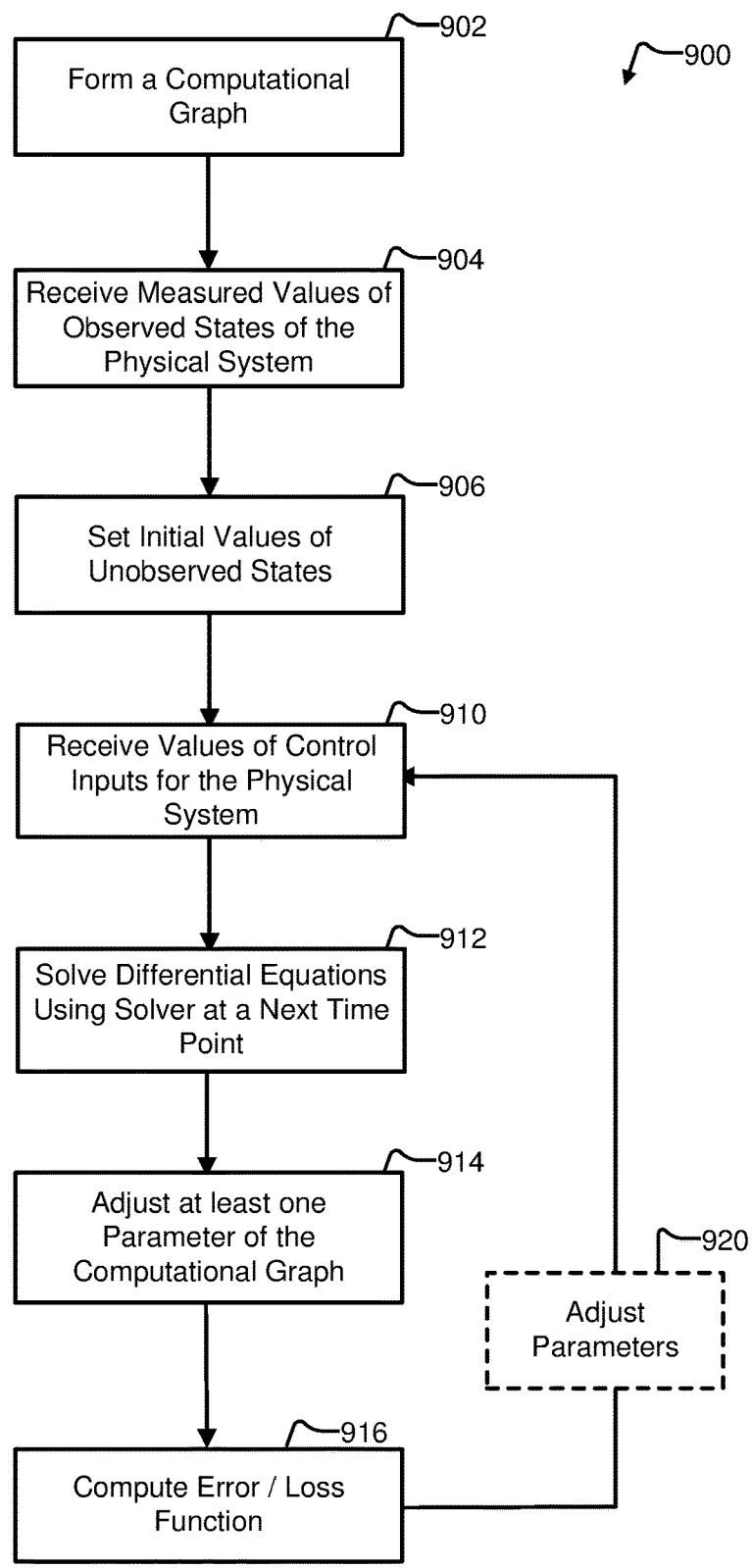
FIG. 9 is a flowchart of a method of simulating a physical system, in accordance with some implementations described herein.

FIG. 9: Simulation Methodology

FIG. 9 is a flowchart of an example method 900 of simulating a physical system 700, in accordance with some implementations. The method 900 begins at block 902.

In block 902, a computational graph is formed. The computational graph may be formed according to method 800, above. The computational graph may include a plurality of nodes, for example, that are initialized with respective parameters. Generally, the structure of the computational graph may be similar to graph 600. Additionally, the forming of the computational graph includes defining a respective differential equation that specifies a time derivative for each of x and y. It is noted that in some implementations, latent states z are also defined based on a respective differential equation that specifies a time derivative of latent states z. Block 902 is followed by block 904.

In block 904, measured values of one or more observed states (x) of the physical system are received. For example, a plurality of sensors may be distributed within an interior 731 of a physical system 700 such that the measured values may be obtained. The sensors may include, but are not limited to, photo sensors (for detecting incident light), acoustic sensors (to detect pests and/or audible motion), humidity sensors (to detect relative humidity), temperature sensors (e.g., reverse biased PN-junctions, temperature-dependent potentiometers/resistors, temperature-dependent transistors, thermocouples, thermometers, etc.), chemical detectors (to detect the use/overuse of chemical agents, pesticides, fertilizers, etc.), hygrometers, electrical resistance sensors, dissolved oxygen sensors, fluid sensors, cameras, microphones, and other suitable sensors. Block 904 is followed by block 906.

In block 906, initial values of unobserved states are set based upon prior knowledge of systems similar to the physical system 700. The initial values may be considered a basic framework from which a trained neural network is formed. One or more unobserved states (y) of the physical system can each correspond to a physical state of the physical system that is not measured or is assumed to be at or near the initial state. The unobserved states (y) are unobservable due to technological or hardware limitations, for example. One or more latent states (z) of the physical system can also correspond to additional factors that affect the physical system, as described in detail above. Block 906 is followed by block 910.

In block 910, values of one or more control inputs (a) for the physical system are received. The one or more control inputs (a) can include, for example, openness of a thermal screen, openness of ventilation compartments, set temperature of heating pipes, extra CO2 pumped into the system, and similar suitable control inputs. The one or more control inputs (a) can further include lighting inputs (e.g., on/off or dimmability), ventilation (e.g., for cooling effect and moisture removal), heating (e.g., through changing the valve values of the heating pipes), CO2 enrichment, and other suitable control inputs. Block 910 is followed by block 912.

In block 912, differential equations specifying the time derivative for each of x and y, are solved. For example, an ordinary differential equation solver (406) may be used to provide solutions to each differential equation. The solutions to the differential equations are used to obtain a predicted value for x, and y, at a next point in time t. This prediction may be used to tune and implement reinforced learning as described above. In some implementations, differential equations for latent states z may also be solved by the ordinary differential equation solver (406), and predicted values of z may also be obtained. Block 912 is followed by block 914.

In block 914, at least one of the parameters for the formed computational graph are adjusted based upon a comparison of the predicted value of x at the next point in time t, and, a groundtruth value of x as measured in the physical system. The comparison may be based on a threshold comparison such that an approach towards a viable solution is created. Alternatively, the comparison may be based on a rounded value, or on a direct comparison. Block 914 is followed by block 916.

At block 916, an error and/or loss function is computed as the predicted value and one or more measured groundtruths. The method may then iteratively adjust parameters (920), based upon the loss function, by iteratively performing blocks 910-916, as illustrated. In this manner, the MBRL agent 121 may fine-tune its neural network based upon observed states of the physical system 700 and predicted states of its predictive model through computation of error and/or a loss function.

It is noted that block 916 may be varied in many ways. For example, a fixed number of iterations may be performed in some implementations. Alternatively, in some implementations, different stopping criteria including a drop in error reduction rate, or when a simulated yield no longer increases, may be implemented. Furthermore, a determination may also be used a stopping condition whereby a threshold or other measurement is used for a determination on how many iterations to execute.

As described above, a learning-based control model for planning and finding an improved or optimal control decision is based on updating a neural network by observing trajectories in a physical system while simulating said physical system. Using a plurality of additional factors to implement a set of initial parameters, the described MBRL agent 121 may alter control decisions and compare resulting predicted values to output of the physical system. Using these comparisons, the MBRL agent 121 may be updated through reinforcement learning and provide increasingly optimal results.

The comparisons, groundtruths, and other variables may be aggregated after acting/action by the MBRL agent 121, such that appropriate data analytics is fed back to the predictive model of the MBRL agent 121. This general framework for the MBRL agent 121 comprises a feedback loop of reinforced learning that can learn optimal or near optimal routes to increasing yield & quality of naturally grown food products while reducing nuisance factors such as excess foliage and pests, and also reducing natural resources used to provide nutritional requirements to plant species within the physical system.

Figure 10:
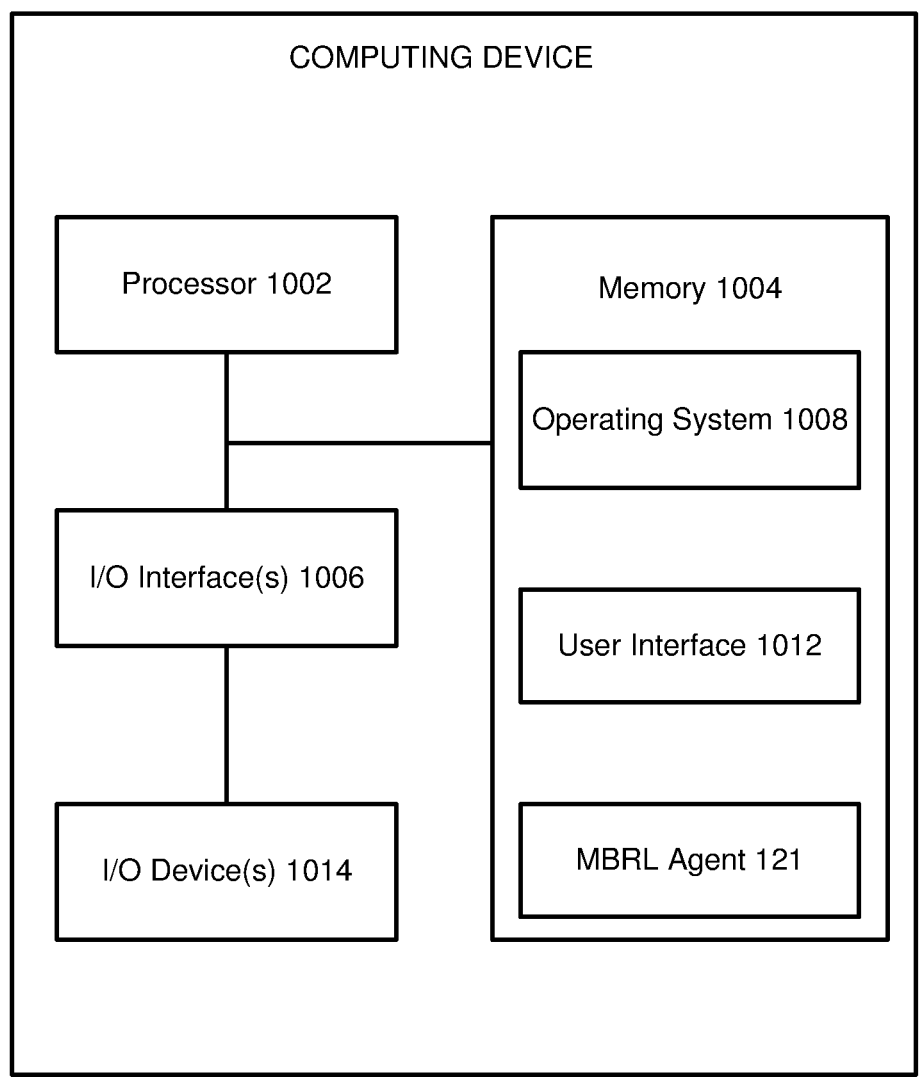
FIG. 10 is a block diagram illustrating an example computing device which may be used to implement one or more features described herein, in accordance with some implementations.

FIG. 10: Computer Apparatuses

Hereinafter, a more detailed description of various computing devices that may be used to implement different devices (e.g., the server 102, computing device 104, and/or client device(s) 110) and components (e.g., the MBRL agent 121) illustrated in FIG. 1, is provided with reference to FIG. 10. In one example, device 1000 may be used to implement the client device 110 and implement the MBRL interface 112 used to communicate with the server 102 and/or MBRL agent 121 of computing system 104. Computing device 1000 can be any suitable computer system, server, or other electronic or hardware device. For example, the computing device 1000 can be a mainframe computer, desktop computer, workstation, portable computer, or electronic device (portable device, mobile device, cell phone, smartphone, tablet computer, television, TV set top box, personal digital assistant (PDA), media player, game device, wearable device, etc.). In some implementations, device 1000 includes a processor 1002, a memory 1004, input/output (I/O) interface 1006, and audio/video input/output devices 1014.

Processor 1002 can be one or more processors and/or processing circuits to execute program code and control basic operations of the device 1000. A "processor" includes any suitable hardware and/or software system, mechanism or component that processes data, signals or other information. A processor may include a system with a general-purpose central processing unit (CPU), multiple processing units, dedicated circuitry for achieving functionality, or other systems. Processing need not be limited to a particular geographic location, or have temporal limitations. For example, a processor may perform its functions in "real-time," "offline," in a "batch mode," etc. Portions of processing may be performed at different times and at different locations, by different (or the same) processing systems. A computer may be any processor in communication with a memory.

Memory 1004 is typically provided in device 1000 for access by the processor 1002, and may be any suitable processor-readable storage medium, e.g., random access memory (RAM), read-only memory (ROM), Electrical Erasable Read-only Memory (EEPROM), Flash memory, etc., suitable for storing instructions for execution by the processor, and located separate from processor 1002 and/or integrated therewith. Memory 1004 can store software operating on the server device 1000 by the processor 1002, including an operating system 1008, a user interface 1012, and/or the MBRL agent 121. In some implementations, MBRL agent 121 can include instructions that enable processor 1002 to perform the functions (or control the functions of) described herein, e.g., some or all of the methods described with respect to FIG. 3, FIGS. 4A-4C, FIG. 8 and FIG. 9.

Any of software in memory 1004 can be stored on any other suitable storage location or computer-readable medium. In addition, memory 1004 (and/or other connected storage device(s)) can store instructions and data used in the features described herein. Memory 1004 and any other type of storage (magnetic disk, optical disk, magnetic tape, or other tangible media) can be considered "storage" or "storage devices."

I/O interface 1006 can provide functions to enable interfacing the server device 1000 with other systems and devices. For example, network communication devices, storage devices (e.g., memory and/or data store 108), and input/output devices can communicate via interface 1006. In some implementations, the I/O interface can connect to interface devices including input devices (keyboard, pointing device, touchscreen, microphone, camera, scanner, etc.) and/or output devices (display device, speaker devices, printer, motor, etc.).

The audio/video input/output devices 1014 can include a user input device (e.g., a mouse, a touchscreen, a touchpad, a microphone, etc.) that can be used to receive user input, a display device (e.g., screen, monitor, touchscreen etc.) and/or a combined input and display device, that can be used to provide graphical and/or visual output.

For ease of illustration, FIG. 10 shows one block for each of processor 1002, memory 1004, I/O interface 1006, and software blocks 1008 and 1012. These blocks may represent one or more processors or processing circuitries, operating systems, memories, I/O interfaces, applications, and/or software engines. In other implementations, device 1000 may not have all of the components shown and/or may have other elements including other types of elements instead of, or in addition to, those shown herein. While the online application platform 102 is described as performing operations as described in some implementations herein, any suitable component or combination of components of online application platform 102 or similar system, or any suitable processor or processors associated with such a system, may perform the operations described.

A user device can also implement and/or be used with features described herein. Example user devices can be computer devices including some similar components as the device 1000, e.g., processor(s) 1002, memory 1004, and I/O interface 1006. An operating system, software and applications suitable for the client device can be provided in memory and used by the processor. The I/O interface for a client device can be connected to network communication devices, as well as to input and output devices, e.g., a microphone for capturing sound, a camera for capturing images or video, a mouse or touchpad for capturing user input, a gesture device for recognizing a user gesture, a VR/AR input device (e.g., such as an orientation sensor) for recognizing a head pose or gaze, a touchscreen to detect user input, a microphone to capture user input, audio speaker devices for outputting sound, a display device for outputting images or video, or other output devices. A display device within the audio/video input/output devices 1014, for example, can be connected to (or included in) the device 1000 to display images pre- and post-processing as described herein, where such display device can include any suitable display device, e.g., an LCD, LED, or plasma display screen, CRT, television, monitor, touchscreen, 3-D display screen, projector, or other visual display device.

Some implementations can provide an audio output device, e.g., voice output or synthesis that speaks text.

One or more methods described herein (e.g., method 600 and/or 700) can be implemented by computer program instructions or code, which can be executed on a computer. For example, the code can be implemented by one or more digital processors (e.g., microprocessors or other processing circuitry), and can be stored on a computer program product including a non-transitory computer readable medium (e.g., storage medium), e.g., a magnetic, optical, electromagnetic, or semiconductor storage medium, including semiconductor or solid state memory, magnetic tape, a removable computer diskette, a random access memory (RAM), a read-only memory (ROM), flash memory, a rigid magnetic disk, an optical disk, a solid-state memory drive, etc. The program instructions can also be contained in, and provided as, an electronic signal, for example in the form of software as a service (SaaS) delivered from a server (e.g., a distributed system and/or a cloud computing system). Alternatively, one or more methods can be implemented in hardware (logic gates, etc.), or in a combination of hardware and software. Example hardware can be programmable processors (e.g. Field-Programmable Gate Array (FPGA), Complex Programmable Logic Device), general purpose processors, graphics processors, Application Specific Integrated Circuits (ASICs), and the like. One or more methods can be performed as part of or component of an application running on the system, or as an application or software running in conjunction with other applications and operating system.

One or more methods described herein can be run in a standalone program that can be run on any type of computing device, a program run on a web browser, a mobile application ("app") run on a mobile computing device (e.g., cell phone, smart phone, tablet computer, wearable device (wristwatch, armband, jewelry, headwear, goggles, glasses, etc.), laptop computer, etc.). In one example, a client/server architecture can be used, e.g., a mobile computing device (as a client device) sends user input data to a server device and receives from the server the final output data for output (e.g., for display). In another example, all computations can be performed within the mobile app (and/or other apps) on the mobile computing device. In another example, computations can be split between the mobile computing device and one or more server devices.

Although the description has been described with respect to particular implementations thereof, these particular implementations are merely illustrative, and not restrictive. Concepts illustrated in the examples may be applied to other examples and implementations.

Note that the functional blocks, operations, features, methods, devices, and systems described in the present disclosure may be integrated or divided into different combinations of systems, devices, and functional blocks as would be known to those skilled in the art. Any suitable programming language and programming techniques may be used to implement the routines of particular implementations. Different programming techniques may be employed, e.g., procedural or object-oriented. The routines may execute on a single processing device or multiple processors. Although the steps, operations, or computations may be presented in a specific order, the order may be changed in different particular implementations. In some implementations, multiple steps or operations shown as sequential in this specification may be performed at the same time.

What is claimed is:

1. A computer-implemented method to simulate a physical system, the method comprising:
   forming a computational graph with a plurality of nodes initialized with respective parameters, wherein a structure of the computational graph is based on one or more physical processes in the physical system, wherein the forming includes defining a respective differential equation that specifies a time derivative for each of x and y;
   receiving, from one or more sensors, measured values of one or more observed states of the physical system;
   setting initial values of one or more unobserved states of the physical system, wherein the unobserved states each correspond to a physical state of the physical system that is not measured;
   receiving values of one or more control inputs a for the physical system, wherein the one or more control inputs a are associated with physical control of the physical system; and
   iteratively simulating the physical system on a computer using x, y and a as simulation inputs to the computational graph, wherein the simulating includes:
      solving the differential equations using an ordinary differential equation (ODE) solver to obtain a predicted value for x and y at a next time point; and
      adjusting at least one of the parameters of the computational graph based on a comparison of the predicted value of x at the next point and a groundtruth value of x at the next point as measured in the physical system, wherein the at least one of the parameters is associated with simulation of the physical system.

2. The computer-implemented method of claim 1, wherein the differential equation for the time derivative of x is a sum of two terms, wherein a first term is based on a physics-based model of the physical system.

3. The computer-implemented method of claim 2, wherein the values of x, y, and a are inputs to the physics-based model, and the first term is output by the physics-based model.

4. The computer-implemented method of claim 2, wherein the values of x, y, and a are inputs to a correction network, and a second term of the two terms is output by the correction network.

5. The computer-implemented method of claim 4, wherein the physics-based model is trained by adjusting one or more model parameters of the physics-based model based on a difference between predicted values of x generated during the simulation with groundtruth values obtained from the one or more sensors.

6. The computer-implemented method of claim 4, wherein the correction network is a neural network trained by adjusting one or more model parameters of the neural network based on a difference between predicted values of x generated during the simulation with groundtruth values obtained from the one or more sensors.

7. The computer-implemented method of claim 4, wherein the physics-based model and the correction network are trained jointly to adjust respective model parameters.

8. The computer-implemented method of claim 1, wherein the differential equation for the time derivative of x is a sum of two terms, wherein a first term is based on a physics-based model of the physical system and a second term is based on a correction network, and wherein the physics-based model and the correction network are each adjusted based on outputs of a user-defined loss function.

9. The computer-implemented method of claim 1, wherein the computational graph is a first computational graph, and wherein the method further comprises:
   forming another computational graph for a reinforcement learning controller having a plurality of nodes initialized with respective parameters, wherein a structure of the computational graph takes x and y, or a history of x and y, and outputs the one or more control inputs a;
   receiving, from one or more sensors, measured values of one or more observed states of the physical system;
   setting initial values of one or more unobserved states of the physical system, wherein the unobserved states each correspond to a physical state of the physical system that is not measured;
   iteratively simulating the physical system with the reinforcement learning controller using x, y as simulation inputs to the another computational graph, wherein the simulating includes:
      using the reinforcement learning controller to output control input a for the physical system; and
      solving the differential equations using an ordinary differential equation (ODE) solver to obtain a predicted value for x and y at a next time point;
      adjusting at least one of the parameters of the another computational graph of the reinforcement learning controller in order to improve and maximize user-defined reward functions; and
      repeating the iteratively simulating until a stopping criteria occurs.

10. The computer-implemented method of claim 1, wherein:
    the physical system is a greenhouse;
    the greenhouse comprises one or more devices configured to alter one or more physical characteristics within an interior of the greenhouse; and
    the operations further comprise automatically adjusting the one or more devices based on the iteratively simulating.

11. A computer system to simulate and control a physical system, the computer system comprising:
    a memory with instructions stored thereon; and
    a processing device, coupled to the memory, the processing device configured to access the memory and execute the instructions, wherein the instructions cause the processing device to implement a model-based reinforced-learning (MBRL) agent that perform operations comprising:
       forming a computational graph with a plurality of nodes initialized with respective parameters, wherein a structure of the computational graph is based on one or more physical processes in the physical system, wherein the forming includes defining a respective differential equation that specifies a time derivative for each of x and y;
       receiving, from one or more sensors, measured values of one or more observed states of the physical system;
       setting initial values of one or more unobserved states of the physical system, wherein the unobserved states each correspond to a physical state of the physical system that is not measured
       receiving values of one or more control inputs a for the physical system, wherein the one or more control inputs a are associated with physical control of the physical system; and iteratively simulating the physical system using x, y and a as simulation inputs to the computational graph, wherein the simulating includes:
  solving the differential equations using an ordinary differential equation (ODE) solver to obtain a predicted value for x and y at a next time point; and
  adjusting at least one of the parameters of the computational graph based on a comparison of the predicted value of x at the next point and a groundtruth value of x at the next point as measured in the physical system, wherein the at least one of the parameters is associated with simulation of the physical system.

12. The computer system of claim 11, wherein the differential equation for the time derivative of x is a sum of two terms, wherein a first term is based on a physics-based model of the physical system and a second term is determined using a correction network.

13. The computer system of claim 12, wherein the values of x, y, and a are inputs to the physics-based model, and the first term is output by the physics-based model.

14. The computer system of claim 12, wherein the values of x, y, and a are inputs to the correction network, and the second term is output by the correction network.

15. The computer system of claim 12, wherein the physics-based model is trained by adjusting one or more model parameters of the physics-based model based on a difference between predicted values of x generated during the simulation with groundtruth values obtained from the one or more sensors.

16. The computer system of claim 12, wherein the correction network is trained by adjusting one or more model parameters of the correction network based on a difference between predicted values of x generated during the simulation with groundtruth values obtained from the one or more sensors.

17. The computer system of claim 16, wherein adjusting the one or more model parameters is based on a regularization term.

18. The computer system of claim 12, wherein the physics-based model and the correction network are trained jointly to adjust respective model parameters.

19. The computer system of claim 12, wherein parameters of the correction network are adjusted during the simulation.

20. An automated greenhouse, comprising:
  a foundation with at least one growth medium for growing one or more plants within an interior of the automated greenhouse;
  one or more controllers configured to alter one or more physical characteristics within an interior of the automated greenhouse; and
  a computer system configured to control the one or more controllers, the computer system comprising:
    a memory with instructions stored thereon; and
    a processing device, coupled to the memory, the processing device configured to access the memory and execute the instructions, wherein the instructions cause the processing device to implement a model-based reinforced-learning (MBRL) agent that perform operations comprising:
      forming a computational graph with a plurality of nodes initialized with respective parameters, wherein a structure of the computational graph is based on one or more physical processes in the automated greenhouse, wherein the forming includes defining a respective differential equation that specifies a time derivative for each of x, y, and z;
      receiving, from one or more sensors, measured values of one or more observed states of the automated greenhouse;
    setting initial values of:
      one or more unobserved states of the automated greenhouse, wherein the unobserved states each correspond to a physical state of the automated greenhouse that is not measured; and
      one or more latent states for the automated greenhouse, wherein the latent states correspond to one or more additional factors that affect the automated greenhouse;
    receiving values of one or more control inputs a for the automated greenhouse, wherein the one or more control inputs a are associated with physical control of the automated greenhouse; and
    iteratively simulating the automated greenhouse using x, y, z, and a as simulation inputs to the computational graph, wherein the simulating includes:
      solving the differential equations using an ordinary differential equation (ODE) solver to obtain a predicted value for x, y, and z at a next time point; and
      adjusting at least one of the parameters of the computational graph based on a comparison of the predicted value of x at the next point and a groundtruth value of x at the next point as measured in the automated greenhouse, wherein the at least one of the parameters is associated with simulation of the automated greenhouse.

* * * * *